(12) United States Patent
Park et al.

(10) Patent No.: US 9,184,376 B2
(45) Date of Patent: *Nov. 10, 2015

(54) MEMORY DEVICES AND METHODS OF MANUFACTURING THE SAME

(71) Applicant: Samsung Electronics Co., Ltd., Suwon-si, Gyeonggi-do (KR)

(72) Inventors: Sang Hwan Park, Hwaseong-si (KR); Soonoh Park, Suwon-si (KR); Sangyong Kim, Suwon-si (KR); Joonmyoung Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/315,610

(22) Filed: Jun. 26, 2014

(65) Prior Publication Data

US 2015/0162525 A1 Jun. 11, 2015

(30) Foreign Application Priority Data

Dec. 9, 2013 (KR) .................. 10-2013-0152430

(51) Int. Cl.
*H01L 43/10* (2006.01)
*H01L 43/08* (2006.01)

(52) U.S. Cl.
CPC ............... *H01L 43/10* (2013.01); *H01L 43/08* (2013.01)

(58) Field of Classification Search
CPC ......... H01L 43/02; H01L 43/08; H01L 43/10; G11C 11/14–11/16; G11C 11/161
See application file for complete search history.

(56) References Cited

U.S. PATENT DOCUMENTS

| 6,326,637 | B1 | 12/2001 | Parkin et al. | |
| 6,838,740 | B2 * | 1/2005 | Huai et al. | 257/421 |
| 7,488,609 | B1 | 2/2009 | Lin et al. | |
| 8,194,365 | B1 | 6/2012 | Leng et al. | |
| 8,325,448 | B2 | 12/2012 | Zhang et al. | |
| 8,394,649 | B2 | 3/2013 | Djayaprawira et al. | |
| 8,546,897 | B2 * | 10/2013 | Ohmori et al. | 257/421 |
| 8,796,796 | B2 * | 8/2014 | Watts et al. | 257/421 |
| 2009/0202866 | A1 | 8/2009 | Kim et al. | |
| 2009/0229111 | A1 | 9/2009 | Zhao et al. | |
| 2011/0062537 | A1 * | 3/2011 | Oh et al. | 257/421 |
| 2012/0146167 | A1 * | 6/2012 | Huai et al. | 257/421 |
| 2013/0028013 | A1 | 1/2013 | Ikeda et al. | |
| 2013/0154035 | A1 | 6/2013 | Krounbi et al. | |
| 2013/0187248 | A1 | 7/2013 | Kariyada et al. | |
| 2013/0299929 | A1 * | 11/2013 | Watanabe et al. | 257/421 |
| 2014/0264671 | A1 * | 9/2014 | Chepulskyy et al. | 257/421 |

FOREIGN PATENT DOCUMENTS

| JP | 2009164628 | 7/2009 |
| JP | 2013016645 | 1/2013 |

* cited by examiner

*Primary Examiner* — Allison P Bernstein
(74) *Attorney, Agent, or Firm* — Myers Bigel Sibley & Sajovec, P.A.

(57) ABSTRACT

A magnetic memory device may include a substrate and a magnetic tunnel junction memory element on the substrate. The magnetic tunnel junction memory element may include a reference magnetic layer, a tunnel barrier layer, and a free magnetic layer. The reference magnetic layer may include a first pinned layer, an exchange coupling layer, and a second pinned layer. The exchange coupling layer may be between the first and second pinned layers, and the second pinned layer may include a ferromagnetic layer and a non-magnetic layer. The second pinned layer may be between the first pinned layer and the tunnel barrier layer, and the tunnel barrier layer may be between the reference magnetic layer and the free magnetic layer.

33 Claims, 27 Drawing Sheets

MEMORY DEVICES AND METHODS OF MANUFACTURING THE SAME

CROSS-REFERENCE TO RELATED APPLICATION

This U.S. non-provisional patent application claims priority under 35 U.S.C. §119 to Korean Patent Application No. 10-2013-0152430, filed on Dec. 9, 2013, in the Korean Intellectual Property Office, the disclosure of which is hereby incorporated by reference in its entirety.

BACKGROUND

Inventive concepts disclosed herein relate to semiconductor devices and methods of manufacturing the same and, more particularly, to magnetic memory devices and methods of manufacturing the same.

Semiconductor devices are widely used in an electronic industry because of their small size, multiple functionalities, and/or low manufacturing costs. Semiconductor memory devices may store logic data. Magnetic memory devices may provide high speed and/or non-volatile characteristics. Accordingly, magnetic memory devices are likely to be used as next generation memory devices.

Generally, a magnetic memory device may include a magnetic tunnel junction (MTJ) pattern. The MTJ pattern may include two magnetic bodies and an insulating layer therebetween. A resistance value of the MTJ may be changed depending on magnetization directions of the two magnetic bodies. For example, if the magnetization directions of the two magnetic bodies are anti-parallel to each other, the MTJ pattern may have a relatively high resistance value. If the magnetization directions of the two magnetic bodies are parallel to each other, the MTJ pattern may have a relatively low resistance value. A magnetic memory device may thus write and/or read data using a difference between the resistance values.

SUMMARY

Embodiments of inventive concepts may provide magnetic memory devices having increased reliability and methods of manufacturing the same.

Embodiments of inventive concepts may also provide magnetic memory devices having increased tunneling magnetoresistance ratios (TMRs) and methods of manufacturing the same.

Embodiments of inventive concepts may also provide magnetic memory devices capable of reducing or minimizing characteristic deterioration at high temperatures and methods of manufacturing the same.

In one aspect of inventive concepts, a magnetic memory device may include a reference magnetic pattern and a free magnetic pattern on a substrate and a tunnel barrier pattern between the reference and free magnetic patterns. Magnetization directions of the reference and free magnetic patterns may be substantially perpendicular to an interface between the free magnetic pattern and the tunnel barrier pattern. The reference magnetic pattern may include a first pinned pattern, a second pinned pattern between the first pinned pattern and the tunnel barrier pattern, and an exchange coupling pattern between the first and second pinned patterns. The second pinned pattern may include a polarization enhancement magnetic pattern adjacent to the tunnel barrier pattern, an exchange-coupling enhancement magnetic pattern adjacent to the exchange coupling pattern, an intermediate magnetic pattern between the polarization enhancement magnetic pattern and the exchange-coupling enhancement magnetic pattern, and a non-magnetic pattern contacting the intermediate magnetic pattern to induce interfacial perpendicular magnetic anisotropy.

In some embodiments, the non-magnetic pattern may have the same crystal structure as the intermediate magnetic pattern.

In some embodiments, the polarization enhancement magnetic pattern may have the same crystal structure as the non-magnetic pattern and the intermediate magnetic pattern.

In some embodiments, the non-magnetic pattern and the intermediate magnetic pattern may have a body-centered cubic (BCC) crystal structure.

In some embodiments, the non-magnetic pattern may include tungsten, and the intermediate magnetic pattern may include iron (Fe) or iron-boron (FeB).

In some embodiments, the first pinned pattern may have a crystal structure different from that of the non-magnetic pattern.

In some embodiments, the first pinned pattern may include a cobalt-platinum (CoPt) alloy, or a [Co/Pt]nL1$_1$ superlattice (where "n" is a natural number).

In some embodiments, the free magnetic pattern may include a first free magnetic pattern and a second free magnetic pattern, and an insertion pattern between the first and second magnetic patterns. The insertion pattern may be in contact with the first and second free magnetic patterns to induce interfacial perpendicular magnetic anisotropy.

In some embodiments, the insertion pattern may have a melting point higher than that of tantalum.

In some embodiments, the exchange-coupling enhancement magnetic pattern may include an element different from an element included in the intermediate magnetic pattern, and the polarization enhancement magnetic pattern may include an element different from an element included in the intermediate magnetic pattern.

In some embodiments, the first pinned pattern, the exchange coupling pattern, the second pinned pattern, the tunnel barrier pattern, and the free magnetic pattern may be sequentially stacked on the substrate.

In some embodiments, the exchange-coupling enhancement magnetic pattern, the non-magnetic pattern, the intermediate magnetic pattern, and the polarization enhancement magnetic pattern may be sequentially stacked on the exchange coupling pattern.

In some embodiments, the second pinned pattern may further include a second non-magnetic pattern disposed between the intermediate magnetic pattern and the polarization enhancement magnetic pattern. The second non-magnetic pattern may include the same material as the non-magnetic pattern.

In some embodiments, the exchange-coupling enhancement magnetic pattern, the intermediate magnetic pattern, the non-magnetic pattern, and the polarization enhancement magnetic pattern may be sequentially stacked on the exchange coupling pattern.

In some embodiments, the non-magnetic pattern and the intermediate magnetic pattern may be alternately and repeatedly stacked at least two times on the exchange coupling pattern.

In some embodiments, the magnetic memory device may further include a capping oxide pattern disposed on the free magnetic pattern. The capping oxide pattern may be in contact with the free magnetic pattern to induce interfacial perpendicular magnetic anisotropy.

In some embodiments, the magnetic memory device may further include a seed pattern disposed between the substrate and the first pinned pattern and having the same crystal structure as the first pinned pattern, and a capping electrode disposed on the free magnetic pattern.

In some embodiments, the free magnetic pattern, the tunnel barrier pattern, the second pinned pattern, the exchange coupling pattern, and the first pinned pattern may be sequentially stacked on the substrate.

In another aspect, a method of manufacturing a magnetic memory device may include forming a reference magnetic layer, a free magnetic layer, and a tunnel barrier layer disposed therebetween. The reference magnetic layer may include a first pinned layer, a second pinned layer between the first pinned layer and the tunnel barrier layer, and an exchange coupling layer between the first and second pinned layers. The second pinned layer may include a polarization enhancement magnetic layer adjacent to the tunnel barrier layer, an exchange-coupling enhancement magnetic layer adjacent to the exchange coupling layer, an intermediate magnetic layer between the polarization enhancement magnetic layer and the exchange-coupling enhancement magnetic layer, and a non-magnetic layer contacting the intermediate magnetic pattern to induce interfacial perpendicular magnetic anisotropy.

In some embodiments, the method may further include performing a thermal treatment process after forming at least the free magnetic layer, the tunnel barrier layer, and the polarization enhancement magnetic layer.

In some embodiments, a process temperature of the thermal treatment process may be in a range of about 400° C. to about 600° C.

In some embodiments, the reference magnetic layer, the tunnel barrier layer, and the free magnetic layer may be sequentially formed on the substrate, and the thermal treatment process may be performed after the formation of the free magnetic layer.

In some embodiments, the non-magnetic layer may function as a diffusion barrier against atoms of the first pinned layer which are diffused toward the polarization enhancement magnetic layer during the thermal treatment process.

According to another aspect of inventive concepts, a magnetic memory device may include a substrate, and a magnetic tunnel junction memory element on the substrate. The magnetic tunnel junction memory element may include a reference magnetic layer, a tunnel barrier layer, and a free magnetic layer. The reference magnetic layer may include a first pinned layer, an exchange coupling layer, and a second pinned layer, wherein the exchange coupling layer is between the first and second pinned layers, and wherein the second pinned layer includes a ferromagnetic layer and a non-magnetic layer. The second pinned layer may be between the first pinned layer and the tunnel barrier layer, and the tunnel barrier layer may be between the reference magnetic layer and the free magnetic layer.

In some embodiments, the ferromagnetic layer may include at least one of cobalt (Co), iron (Fe), iron-boron (FeB), and/or cobalt-iron-boron (CoFeB).

In some embodiments, the non-magnetic layer may include at least one of tungsten (W) and/or tantalum (Ta).

In some embodiments, the ferromagnetic layer may be a first ferromagnetic layer, the second pinned layer may include a second ferromagnetic layer, the non-magnetic layer may be between the first and second ferromagnetic layers.

The first ferromagnetic layer may be between the non-magnetic layer and the exchange coupling layer, the first ferromagnetic layer may include cobalt (Co), and the second ferromagnetic layer may include at least one of iron (Fe) and/or iron-boron (FeB). The first ferromagnetic layer may be between the non-magnetic layer and the exchange coupling layer, the first ferromagnetic layer may include at least one of iron (Fe) and/or iron-boron (FeB), and the second ferromagnetic layer may include cobalt-iron-boron (CoFeB). The first ferromagnetic layer may be between the non-magnetic layer and the exchange coupling layer, the first ferromagnetic layer may include cobalt (Co), and the second ferromagnetic layer may include cobalt-iron-boron (CoFeB).

In some embodiments, the non-magnetic layer may be a first non-magnetic layer, the second pinned layer may include a second non-magnetic layer, and the ferromagnetic layer may be between the first and second non-magnetic layers. The first non-magnetic layer may include at least one of tungsten (W) and/or tantalum (Ta), and the ferromagnetic layer may include iron and/or iron-boron.

In some embodiments, the ferromagnetic layer may be a first ferromagnetic layer, the non-magnetic layer may be a first non-magnetic layer on the first ferromagnetic layer, and the second pinned layer may include a second ferromagnetic layer on the first non-magnetic layer, a second non-magnetic layer on the second ferromagnetic layer, and a third ferromagnetic layer on the second non-magnetic layer. The first ferromagnetic layer may include cobalt (Co), the first non-magnetic layer may include at least one of tungsten (W) and/or tantalum (Ta), the second ferromagnetic layer may include at least one of iron (Fe) and/or iron-boron (FeB), the second non-magnetic layer may include at least one of tungsten (W) and/or tantalum (Ta), and the third ferromagnetic layer may include cobalt-iron-boron (CoFeB). The exchange coupling layer and the first ferromagnetic layer may have a first crystal structure, the second ferromagnetic layer and the third ferromagnetic layer may have a second crystal structure, and the first and second crystal structures may be different. The first crystal structure may be a hexagonal close packed (HCP) crystal structure, and the second crystal structure may be a body-centered cubic (BCC) crystal structure. The first and second non-magnetic layers may have a body-centered cubic (BCC) crystal structure.

In some embodiments, magnetization directions of the reference and free magnetic layers may be substantially perpendicular with respect to an interface between the free magnetic layer and the tunnel barrier layer.

In some embodiments, the non-magnetic layer may be between the ferromagnetic layer and the first pinned layer, and the first pinned layer and the ferromagnetic layer may have different crystal structures. The first pinned layer includes a cobalt-platinum (CoPt) alloy and/or a [Co/Pt]nL1$_1$ superlattice, where n is a natural number.

In some embodiments, the reference magnetic layer may be between the tunnel barrier layer and the substrate, the first pinned layer may be between the exchange coupling layer and the substrate, and the tunnel barrier layer may be between the free magnetic layer and the substrate.

In some embodiments, the magnetic memory device may include a capping oxide layer on the free magnetic layer, and the magnetic tunnel junction memory element may be between the capping oxide layer and the substrate. The capping oxide layer may be configured to induce interfacial perpendicular magnetic anisotropy.

In some embodiments, the magnetic memory device may include a seed layer between the substrate and the first pinned layer and a capping electrode on the free magnetic layer, and the magnetic tunnel junction memory element may be between the seed layer and the capping electrode.

In some embodiments, the free magnetic layer may be between the tunnel barrier layer and the substrate, the tunnel barrier layer may be between the second pinned layer and the substrate, the second pinned layer may be between the exchange coupling layer and the substrate, and the exchange coupling layer may be between the first pinned layer and the substrate.

According to still another aspect of inventive concepts, a magnetic memory device may include a substrate and a magnetic tunnel junction memory element on the substrate. The magnetic tunnel junction memory element may include a reference magnetic layer, a tunnel barrier layer, and a free magnetic layer. The reference magnetic layer may include a first pinned layer, an exchange coupling layer, and a second pinned layer. The exchange coupling layer may be between the first and second pinned layers, and the second pinned layer may include a first ferromagnetic layer, a non-magnetic layer, and a second ferromagnetic layer. The non-magnetic layer may be between the first and second ferromagnetic layers, the second pinned layer may be between the first pinned layer and the tunnel barrier layer, and the tunnel barrier layer may be between the reference magnetic layer and the free magnetic layer.

In some embodiments, the non-magnetic layer may include at least one of tungsten (W) and/or tantalum (Ta).

In some embodiments, the first ferromagnetic layer may be between the non-magnetic layer and the exchange coupling layer, the first ferromagnetic layer may include cobalt (Co), and the second ferromagnetic layer may include at least one of iron (Fe) and/or iron-boron (FeB).

In some embodiments, the first ferromagnetic layer may be between the non-magnetic layer and the exchange coupling layer, the first ferromagnetic layer may include at least one of iron (Fe) and/or iron-boron (FeB), and the second ferromagnetic layer may include cobalt-iron-boron (CoFeB).

In some embodiments, the first ferromagnetic layer may be between the non-magnetic layer and the exchange coupling layer, wherein the first ferromagnetic layer comprises cobalt (Co), and wherein the second ferromagnetic layer comprises cobalt-iron-boron (CoFeB).

In some embodiments, the non-magnetic layer may be a first non-magnetic layer, and the second pinned layer may include a second non-magnetic layer on the second ferromagnetic layer and a third ferromagnetic layer on the second non-magnetic layer. The first ferromagnetic layer may include cobalt (Co), the first non-magnetic layer may include at least one of tungsten (W) and/or tantalum (Ta), the second ferromagnetic layer may include at least one of iron (Fe) and/or iron-boron (FeB), the second non-magnetic layer may include at least one of tungsten (W) and/or tantalum (Ta), and the third ferromagnetic layer may include cobalt-iron-boron (CoFeB). The exchange coupling layer and the first ferromagnetic layer may have a first crystal structure, the second ferromagnetic layer and the third ferromagnetic layer may have a second crystal structure, and the first and second crystal structures may be different. The first crystal structure may be a hexagonal close packed (HCP) crystal structure, and the second crystal structure may be a body-centered cubic (BCC) crystal structure. The first and second non-magnetic layers may have a body-centered cubic (BCC) crystal structure.

In some embodiments, the reference magnetic layer may be between the tunnel barrier layer and the substrate, the first pinned layer may be between the exchange coupling layer and the substrate, and the tunnel barrier layer may be between the free magnetic layer and the substrate.

In some embodiments, the free magnetic layer may be between the tunnel barrier layer and the substrate, the tunnel barrier layer may be between the second pinned layer and the substrate, the second pinned layer may be between the exchange coupling layer and the substrate, and the exchange coupling layer may be between the first pinned layer and the substrate.

BRIEF DESCRIPTION OF THE DRAWINGS

Inventive concepts will become more apparent in view of the attached drawings and accompanying detailed description.

DETAILED DESCRIPTION OF THE EMBODIMENTS

Figure 1:
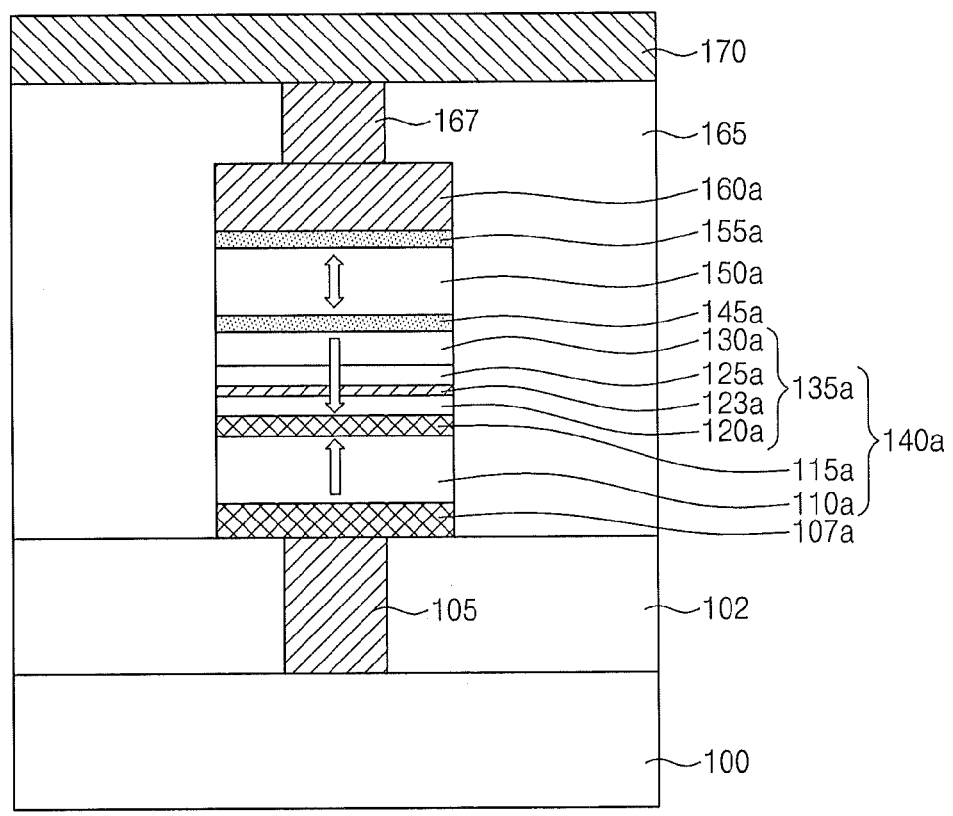
FIG. 1 is a cross-sectional view illustrating a magnetic memory device according to some embodiments of inventive concepts.

Inventive concepts will now be described more fully hereinafter with reference to the accompanying drawings, in which examples of embodiments of inventive concepts are shown. Advantages and features of inventive concepts and methods of achieving them will be apparent from the following examples of embodiments that will be described in more detail with reference to the accompanying drawings. It should be noted, however, that inventive concepts are not limited to the following examples of embodiments, and may be implemented in various forms. Accordingly, the examples of embodiments are provided only to disclose inventive concepts and let those skilled in the art know the category or categories of inventive concepts. In the drawings, embodiments of inventive concepts are not limited to the specific examples provided herein and elements and/or dimensions thereof may be exaggerated for clarity.

Terminology used herein is for the purpose of describing particular embodiments only and is not intended to limit inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, embodiments in the detailed description will be described with respect to sectional views as ideal examples of views of inventive concepts. Accordingly, shapes of the views may be modified according to manufacturing techniques and/or allowable errors/tolerances. Therefore, embodiments of inventive concepts are not limited to specific shapes illustrated in the views, but may include other shapes that may be created according to manufacturing processes. Areas illustrated in the drawings have general properties, and are used to illustrate specific shapes of elements. Thus, particular structures illustrated in the figures should not be construed as limiting with respect to the scope of inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of present inventive concepts. Embodiments of aspects of present inventive concepts explained and illustrated herein may also include their complementary counterparts. The same reference numerals or the same reference designators denote the same elements throughout the specification.

Moreover, examples of embodiments are described herein with reference to cross-sectional illustrations and/or plane illustrations that may be idealized exemplary illustrations. Accordingly, variations from the shapes of the illustrations as a result, for example, of manufacturing techniques and/or tolerances, are to be expected. Thus, examples of embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate an actual shape of a region of a device and are not intended to limit the scope of inventive concepts.

FIG. 1 is a cross-sectional view illustrating a magnetic memory device according to some embodiments of inventive concepts.

Referring to FIG. 1, a lower interlayer insulating layer 102 may be disposed on a substrate 100. The substrate 100 may be a semiconductor substrate (e.g., a silicon substrate, a germanium substrate, or a silicon-germanium substrate). The lower interlayer insulating layer 102 may include at least one of a silicon oxide layer, a silicon nitride layer, and/or a silicon oxynitride layer. In some embodiments, a switching element (not shown) may be formed on the substrate 100, and the lower interlayer insulating layer 102 may cover the switching element. The switching element may be a PN diode or a field effect transistor.

A lower contact plug 105 may penetrate the lower interlayer insulating layer 102. The lower contact plug 105 may be connected to one terminal of the switching element. The lower contact plug 105 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and a metal-semiconductor compound (e.g., a metal silicide).

A reference magnetic pattern 140a and a free magnetic pattern 150a are disposed on the lower interlayer insulating layer 102, and a tunnel barrier pattern 145a is disposed between the reference and free magnetic patterns 140a and 150a. The reference magnetic pattern 140a may have a magnetization direction fixed in one direction. A magnetization direction of the free magnetic pattern 150a may be changed into a parallel direction or an anti-parallel direction relative to the fixed magnetization direction of the reference magnetic pattern 140a by a program operation. The reference and free magnetic patterns 140a and 150a and the tunnel barrier pattern 145a may provide a magnetic tunnel junction (MTJ) pattern.

The magnetization directions of the reference and free magnetic patterns 140a and 150a are perpendicular with respect to an interface between the tunnel barrier pattern 145a and the free magnetic pattern 150a. In other words, the MTJ pattern is a perpendicular type MTJ pattern. The magnetization direction of the free magnetic pattern 150a may be changed using a spin torque transfer (STT) program operation. In other words, the magnetization direction of the free magnetic pattern 150a may be changed using spin torque of electrons in a program current.

The reference magnetic pattern 140a may have a synthetic anti-ferromagnetic (SAF) structure. In more detail, the reference magnetic pattern 140a may include a first pinned pattern 110a, a second pinned pattern 135a between the first pinned pattern 110a and the tunnel barrier pattern 145a, and an exchange coupling pattern 115a between the first and second pinned patterns 110a and 135a.

A magnetization direction of the first pinned pattern 110a may be exchange-coupled with a magnetization direction of the second pinned pattern 135a by the exchange coupling pattern 115a. In other words, the magnetization directions of the first and second pinned patterns 110a and 135a may be anti-parallel to each other by the exchange coupling pattern 115a. The exchange coupling pattern 115a may combine the magnetization directions of the first and second pinned patterns 110a and 135a with each other by Ruderman-Klttel-Kasuya-Yosida (RKKY) interaction. Thus, magnetic fields generated by the magnetization directions of the first and second pinned patterns 110a and 135a may offset each other to reduce or minimize a net magnetic field of the reference magnetic pattern 140a. As a result, it may be possible to reduce or minimize the influence of the magnetic field generated by the reference magnetic pattern 140a on the free magnetic pattern 150a. For example, the exchange coupling pattern 115a may include ruthenium (Ru).

The magnetization direction of the second pinned pattern 135a adjacent to the tunnel barrier pattern 145a corresponds to the fixed magnetization direction of the reference magnetic pattern 140a. In other words, if the magnetization direction of the second pinned pattern 135a is parallel to the magnetization direction of the free magnetic pattern 150a, the MTJ pattern may have a relatively low resistance value. Alternatively, if the magnetization direction of the second pinned pattern 135a is anti-parallel with respect to the magnetization direction of the free magnetic pattern 150a, the MTJ pattern may have a relatively high resistance value.

The first pinned pattern 110a may include a perpendicular magnetic material or a perpendicular magnetic structure. For example, the first pinned pattern 110a may include a cobalt-platinum (CoPt) alloy corresponding to the perpendicular magnetic material, or a (Co/Pt)nL1$_1$ superlattice (where "n" is a natural number). Perpendicular magnetic anisotropy of the CoPt alloy may be increased and/or greatest when a composition ratio of cobalt (Co) to platinum (Pt) of the CoPt alloy is about 70:30. If the first pinned pattern 110a includes the CoPt alloy, saturation magnetization of the first pinned pattern 110a may be reduced for synthetic anti-ferromagnetic coupling of the first and second pinned patterns 110a and 135a. The CoPt alloy may be doped with boron (B) to reduce the saturation magnetization of the CoPt alloy.

The second pinned pattern 135a includes a polarization enhancement magnetic pattern 130a adjacent to the tunnel barrier pattern 145a, an exchange-coupling enhancement magnetic pattern 120a adjacent to the exchange coupling pattern 115a, an intermediate magnetic pattern 125a disposed between the polarization enhancement magnetic pattern 130a and the exchange-coupling enhancement magnetic pattern 120a, and a non-magnetic pattern 123a contacting the intermediate magnetic pattern 125a between the polarization enhancement magnetic pattern 130a and the exchange-coupling enhancement magnetic pattern 120a. The polarization enhancement magnetic pattern 130a may be in contact with the tunnel barrier pattern 145a, and the exchange-coupling enhancement magnetic pattern 120a may be in contact with the exchange coupling pattern 115a.

The exchange-coupling enhancement magnetic pattern 120a may include a magnetic material capable of enhancing the RKKY interaction of the exchange coupling pattern 115a. For example, the exchange-coupling enhancement magnetic pattern 120a may include cobalt (Co).

The non-magnetic pattern 123a includes a conductive material (e.g., a metal) capable of inducing interfacial perpendicular magnetic anisotropy (i-PMA) at an interface of the non-magnetic pattern 123a and the intermediate magnetic pattern 125a. The non-magnetic pattern 123a may have the same crystal structure as the intermediate magnetic pattern 125a. For example, the non-magnetic pattern 123a and the intermediate magnetic pattern 125a may have a body-centered cubic (BCC) crystal structure. Additionally, the non-magnetic pattern 123a and the intermediate magnetic pattern 125a may have the same crystal structure as the polarization enhancement magnetic pattern 130a. For example, the non-magnetic pattern 123a may include tungsten (W).

The intermediate magnetic pattern 125a may include an element different from that of the exchange-coupling enhancement magnetic pattern 120a. In some embodiments, a degree of the interfacial perpendicular magnetic anisotropy between the intermediate magnetic pattern 125a and the non-magnetic pattern 123a may be greater than a degree of interfacial perpendicular magnetic anisotropy between the exchange-coupling enhancement magnetic pattern 120a and the non-magnetic pattern 123a. For example, the intermediate magnetic pattern 125a may include iron (Fe) or iron-boron (FeB). The iron-boron may be iron doped with boron.

The crystal structure of the non-magnetic pattern 123a may be different from a crystal structure of the exchange-coupling enhancement magnetic pattern 120a. For example, the non-magnetic pattern 123a may have the BCC crystal structure, and the exchange-coupling enhancement magnetic pattern 120a may have a hexagonal close packed (HCP) crystal structure.

Additionally, the crystal structure of the non-magnetic pattern 123a may be different from that of the first pinned pattern 110a. Thus, the crystal structure of the polarization enhancement magnetic pattern 130a may also be different from that of the first pinned pattern 110a. In some embodiments, the first pinned pattern 110a, the exchange coupling pattern 115a and the exchange-coupling enhancement magnetic pattern 120a may have the same crystal structure. For example, the first pinned pattern 110a, the exchange coupling pattern 115a and the exchange-coupling enhancement magnetic pattern 120a may have the HCP crystal structure.

The polarization enhancement magnetic pattern 130a may include a magnetic material capable of generating a high tunneling magnetoresistance ratio by contact with the tunnel barrier pattern 145a. Additionally, the polarization enhancement magnetic pattern 130a may include a magnetic material capable of inducing interfacial perpendicular magnetic anisotropy at an interface between the tunnel barrier pattern 145a and the polarization enhancement magnetic pattern 130a. The polarization enhancement magnetic pattern 130a includes an element different from an element included in the intermediate magnetic pattern 125a. Stated in other words, the polarization enhancement magnetic pattern 130a may include an element that is not significantly included in the intermediate magnetic pattern 125a. As described above, the polarization enhancement magnetic pattern 130a may have the same crystal structure as the non-magnetic pattern 123a and the intermediate magnetic pattern 125a. For example, the polarization enhancement magnetic pattern 130a may include cobalt-iron-boron (CoFeB).

The tunnel barrier pattern 145a may include magnesium oxide (MgO) or aluminum oxide (AlO). In some embodiments, the tunnel barrier pattern 145a may include the magnesium oxide (MgO) having a sodium chloride (NaCl) crystal structure.

The free magnetic pattern 150a may include a magnetic material capable of generating a high tunnel magnetoresistance ratio by contact with the tunnel barrier pattern 145a. Additionally, the free magnetic pattern 150a may include a magnetic material capable of inducing interfacial perpendicular magnetic anisotropy at an interface between the tunnel barrier pattern 145a and the free magnetic pattern 150a. For example, the free magnetic pattern 150a may include cobalt-iron-boron (CoFeB).

Referring again to FIG. 1, the free magnetic pattern 140a, the tunnel barrier pattern 145a and the free magnetic pattern 150a may be sequentially stacked on the lower interlayer insulating layer 102 in the present embodiment. In other words, the first pinned pattern 110a, the exchange coupling pattern 115a, the second pinned pattern 135a, the tunnel barrier pattern 145a and the free magnetic pattern 150a may be sequentially stacked on the lower interlayer insulating layer 102.

A seed pattern 107a may be disposed between the first pinned pattern 110a and the lower interlayer insulating layer 102. The seed pattern 107a may be electrically connected to a top surface of the lower contact plug 105. In some embodiments, the seed pattern 107a may be formed of a conductive material having the same crystal structure of the first pinned pattern 110a. For example, the seed pattern 107a may have the HCP crystal structure. For example, the seed pattern 107a may include ruthenium (Ru).

In the present embodiment, the exchange-coupling enhancement magnetic pattern 120a, the non-magnetic pattern 123a, the intermediate magnetic pattern 125a and the polarization enhancement magnetic pattern 130a may be sequentially stacked on the exchange coupling pattern 115a. The non-magnetic pattern 123a may be in contact with a top surface of the exchange-coupling enhancement magnetic pattern 120a and a bottom surface of the intermediate magnetic pattern 125a.

A capping oxide pattern 155a may be disposed on a top surface of the free magnetic pattern 150a. The capping oxide pattern 155a may be in contact with the free magnetic pattern 150a, so that interfacial perpendicular magnetic anisotropy may be induced at an interface between the capping oxide pattern 155a and the free magnetic pattern 150a. For example, oxygen atoms in the capping oxide pattern 155a may react with iron atoms in the cobalt-iron-born (CoFeB) of the free magnetic pattern 150a to induce the interfacial perpendicular magnetic anisotropy. Thus, perpendicular magnetic anisotropy of the free magnetic pattern 150a may be improved. The capping oxide pattern 155a may have a sufficient thin thickness such that electrons in an operating current may pass through the capping oxide pattern 155a. For example, the capping oxide pattern 155a may include at least one of magnesium oxide (MgO), tantalum oxide (TaO), and aluminum oxide (AlO).

A capping electrode 160a may be stacked on a top surface of the capping oxide pattern 155a. For example, the capping electrode 160a may include at least one of tantalum (Ta), ruthenium (Ru), titanium (Ti), and platinum (Pt). An upper interlayer insulating layer 165 may be disposed on the lower interlayer insulating layer 102. The upper interlayer insulating layer 165 may cover the capping electrode 160a and the MTJ pattern. An upper contact plug 167 may penetrate the upper interlayer insulating layer 165 and may be connected to the capping electrode 160a. For example, the upper contact plug 167 may include at least one of a metal (e.g., tungsten, titanium, and/or tantalum) or a conductive metal nitride (e.g., titanium nitride, tantalum nitride, and/or tungsten nitride). An interconnection 170 may be disposed on the upper interlayer insulating layer 165. The interconnection 170 may be connected to the upper contact plug 167. In some embodiments, the interconnection 170 may correspond to a bit line. For example, the interconnection 170 may include at least one of a metal (e.g., tungsten, titanium, and/or tantalum) and a conductive metal nitride (e.g., titanium nitride, tantalum nitride, and/or tungsten nitride).

According to the magnetic memory device described above, the second pinned pattern 135a between the exchange coupling pattern 115a and the tunnel barrier pattern 145a includes the non-magnetic pattern 123a and the intermediate magnetic pattern 125a as well as the polarization enhancement magnetic pattern 130a. Here, the interfacial perpendicular magnetic anisotropy is induced at the interface between the non-magnetic pattern 123a and the intermediate magnetic pattern 125a. In other words, the perpendicular magnetic anisotropy of the second pinned pattern 135a may be improved by the non-magnetic pattern 123a and the intermediate magnetic pattern 125a. Thus, the tunneling magnetoresistance ratio of the MTJ pattern may be improved, and it may be possible to reduce or minimize deterioration of characteristics of the MTJ pattern caused by a high temperature.

The free magnetic pattern 150a, the tunnel barrier pattern 145a, and the polarization enhancement magnetic pattern 130a may be thermally treated at a high temperature to improve the tunneling magnetoresistance ratio of the MTJ pattern. If the non-magnetic pattern 123a and the intermediate magnetic pattern 125a are omitted, the perpendicular magnetic anisotropy of the second pinned pattern 135a may be deteriorated by high temperature thermal treatment. However, in embodiments of inventive concepts, the second pinned pattern 135a includes the non-magnetic pattern 123a and the intermediate magnetic pattern 125a, and the non-magnetic pattern 123a induces the interfacial perpendicular magnetic anisotropy at the interface between the non-magnetic pattern 123a and the intermediate magnetic pattern 125a. In other words, the perpendicular magnetic anisotropy of the second pinned pattern may be enhanced in itself, so that it is possible to reduce or minimize the deterioration (e.g. caused by high temperature thermal treatment), of characteristics of the MTJ pattern.

Additionally, the non-magnetic pattern 123a may act as a diffusion barrier against atoms (e.g., platinum atoms) of the first pinned pattern 110a, which may otherwise diffuse toward the polarization enhancement magnetic pattern 130a during high temperature thermal treatment. Thus, reliability of the MTJ pattern may be improved. Additionally, it may be possible to improve process temperature margins of subsequent processes after the formation of the MTJ pattern.

Furthermore, the non-magnetic pattern 123a may have the same crystal structure as the intermediate magnetic pattern 125a. Thus, the non-magnetic pattern 123a may be used as a seed during a deposition process used to form the intermediate magnetic pattern 125a such that the second pinned pattern 135a may be easily fabricated.

Next, modified examples of the magnetic memory device will be described. Hereinafter, differences between the aforementioned embodiment and the modified examples will be described to reduce redundancy of explanation.

Figure 2:
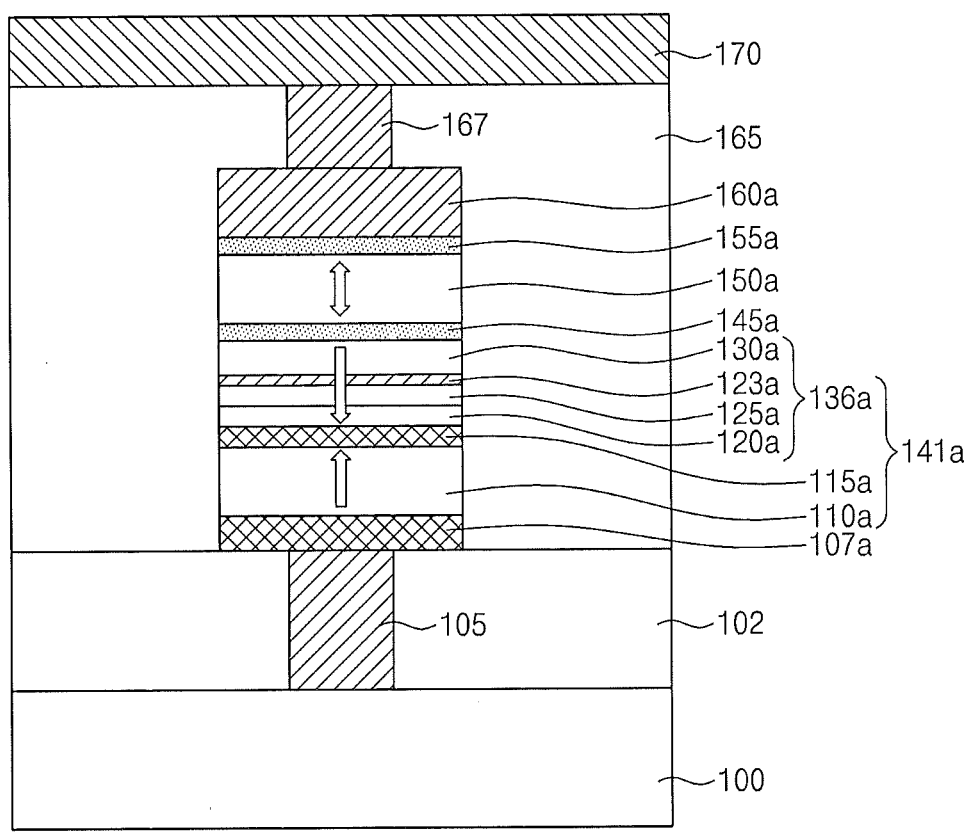
FIG. 2 is a cross-sectional view illustrating a modified example of a magnetic memory device according to some embodiments of inventive concepts.

FIG. 2 is a cross-sectional view illustrating a modified example of a magnetic memory device according to some embodiments of inventive concepts.

Referring to FIG. 2, in a magnetic memory device according to the present modified example, a second pinned pattern 136a of a reference magnetic pattern 141a may include an exchange-coupling enhancement magnetic pattern 120a, an intermediate magnetic pattern 125a, a non-magnetic pattern 123a, and a polarization enhancement magnetic pattern 130a that are sequentially stacked on the exchange coupling pattern 115a. In other words, the intermediate magnetic pattern 125a may be disposed between the non-magnetic pattern 123a and the exchange-coupling enhancement magnetic pattern 120a, and the non-magnetic pattern 123a may be disposed between the intermediate magnetic pattern 125a and the polarization enhancement magnetic pattern 130a.

Figure 3:
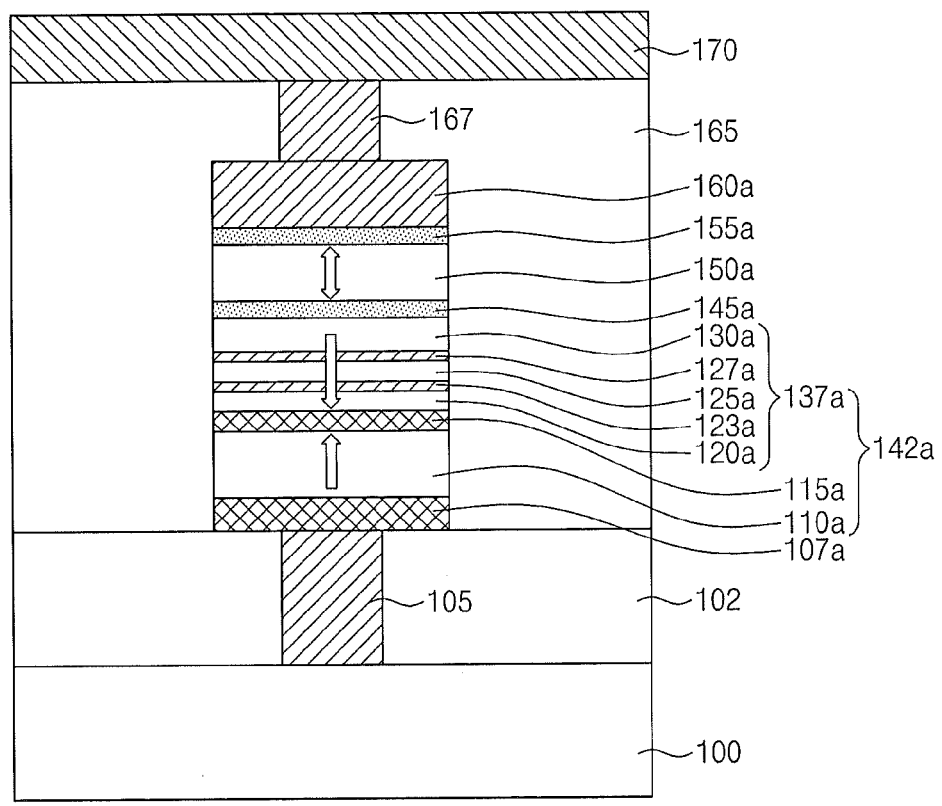
FIG. 3 is a cross-sectional view illustrating another modified example of a magnetic memory device according to some embodiments of inventive concepts.

FIG. 3 is a cross-sectional view illustrating another modified example of a magnetic memory device according to some embodiments of inventive concepts.

Referring to FIG. 3, in a magnetic memory device according to the present modified example, a second pinned pattern 137a of a reference magnetic pattern 142a may further include a second non-magnetic pattern 127a that is in contact with the top surface of the intermediate magnetic pattern 125a. In other words, the non-magnetic pattern 123a may be disposed between the intermediate magnetic pattern 125a and the exchange-coupling enhancement magnetic pattern 120a, and the second non-magnetic pattern 127a may be disposed between the intermediate magnetic pattern 125a and the polarization enhancement magnetic pattern 130a.

The second non-magnetic pattern 127a may be formed of the same material as the non-magnetic pattern 123a. Thus, interfacial perpendicular magnetic anisotropy may also be induced at an interface between the second non-magnetic pattern 127a and the intermediate magnetic pattern 125a. The second non-magnetic pattern 127a may have the same crystal structure as the intermediate magnetic pattern 125a. Additionally, the second non-magnetic pattern 127a may have the same crystal structure as the polarization enhancement magnetic pattern 130a. For example, the second non-magnetic pattern 127a may include tungsten (W).

Figure 4:
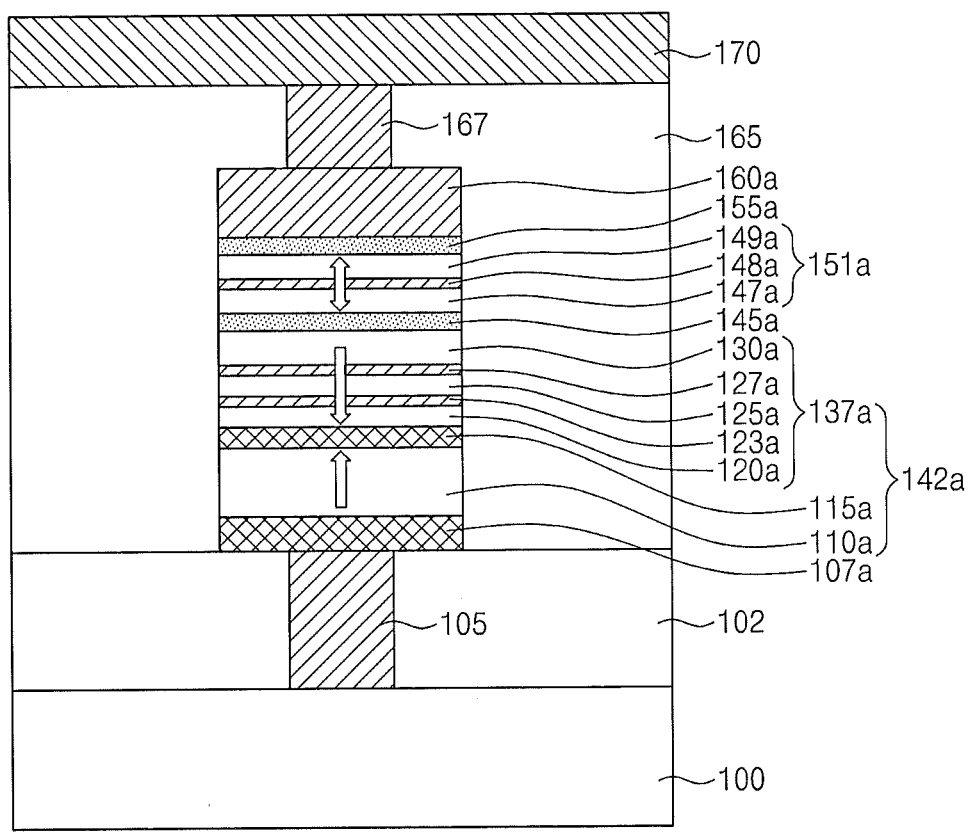
FIG. 4 is a cross-sectional view illustrating still another modified example of a magnetic memory device according to some embodiments of inventive concepts.

FIG. 4 is a cross-sectional view illustrating still another modified example of a magnetic memory device according to some embodiments of inventive concepts.

Referring to FIG. 4, in a magnetic memory device according to the present modified example, a free magnetic pattern 151a may include a first free magnetic pattern 147a, a second free magnetic pattern 149a, and an insertion pattern 148a between the first and second free magnetic patterns 147a and 149a. The first and second free magnetic patterns 147a and 149a may be formed of the same magnetic material as the free magnetic pattern 150a of FIG. 1. The insertion pattern 148a may be in contact with the first and second free magnetic patterns 147a and 149a to induce interfacial perpendicular magnetic anisotropy. Thus, perpendicular magnetic anisotropy of the free magnetic pattern 151a may be improved in itself. Additionally, the insertion pattern 148a may have a melting point higher than that of tantalum (Ta). In some embodiments, the insertion pattern 148a may have the same crystal structure as the first and second free magnetic patterns 147a and 149a. In this case, the insertion pattern 148a may include, for example, tungsten. In other embodiments, the insertion pattern 148a may have a crystal structure different from those of the first and second free magnetic patterns 147a and 149a. In this case, the insertion pattern 148a may include, for example, rhenium (Re).

As a result, a heat-resistance characteristic of the free magnetic pattern 151a may be improved by the insertion pattern 148a. In other words, it may be possible to reduce or minimize deterioration of characteristics of the free magnetic pattern 151a, which may be caused by at least one of a high temperature thermal treatment process and/or a high temperature subsequent process. The free magnetic pattern 151a may also be applied to the magnetic memory devices illustrated in FIGS. 1 and 2.

Figure 5:
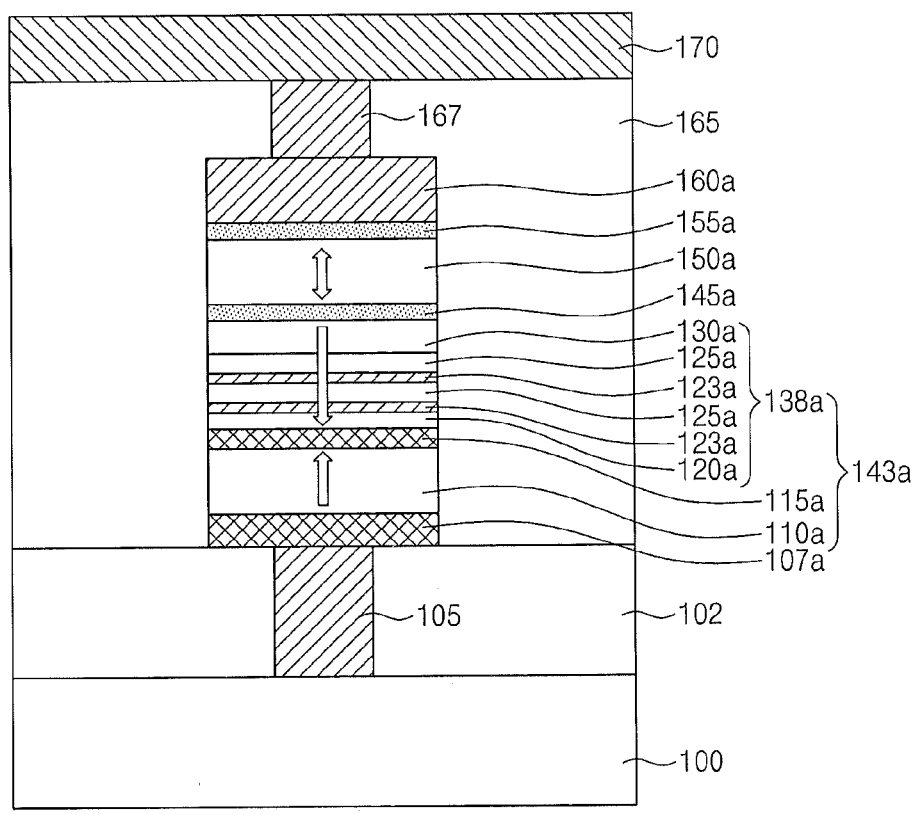
FIG. 5 is a cross-sectional view illustrating yet another modified example of a magnetic memory device according to some embodiments of inventive concepts.

FIG. 5 is a cross-sectional view illustrating yet another modified example of a magnetic memory device according to some embodiments of inventive concepts.

Referring to FIG. 5, in a magnetic memory device according to the present modified example, a second pinned pattern 138a of a reference magnetic pattern 143a may include a plurality of non-magnetic patterns 123a and a plurality of intermediate patterns 125a that are alternately stacked on the exchange-coupling enhancement magnetic pattern 120a between the exchange-coupling enhancement magnetic pattern 120a and the polarization enhancement magnetic pattern 130a. In other words, the non-magnetic pattern 123a and the intermediate patterns 125a may be alternately stacked at least two times between the exchange-coupling enhancement magnetic pattern 120a and the polarization enhancement magnetic pattern 130a. Thus perpendicular magnetic anisotropy of the second pinned pattern 138a may be further improved in itself.

The free magnetic pattern 151a of FIG. 4 may also be applied to the magnetic memory device of FIG. 5.

Next, a method of manufacturing magnetic memory devices according to some embodiments will be described.

Figure 6:
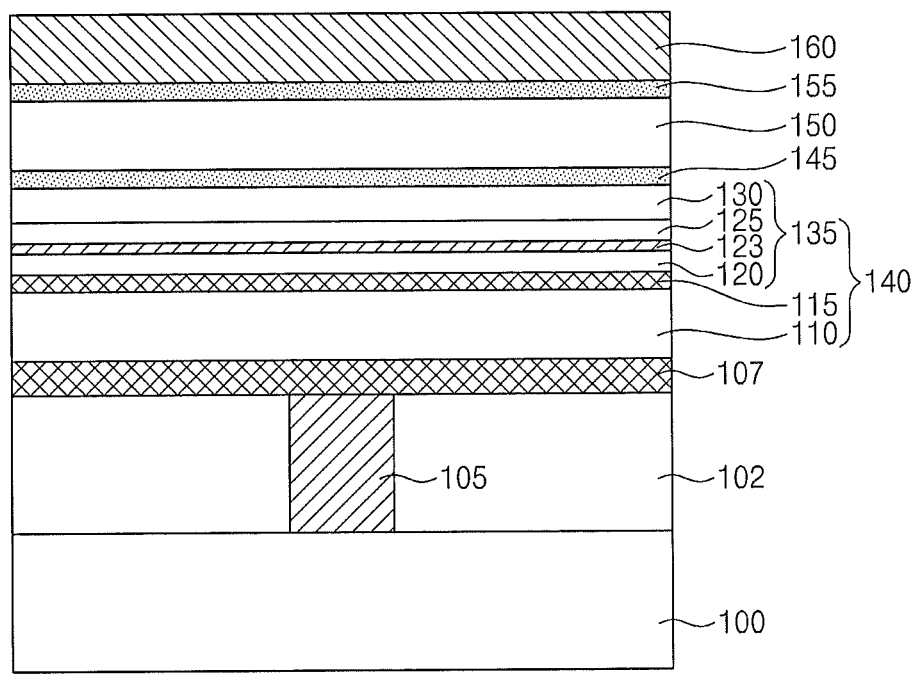
FIGS. 6 and 7 are cross-sectional views illustrating operations of manufacturing a magnetic memory device according to some embodiments of inventive concepts.
Figure 7:
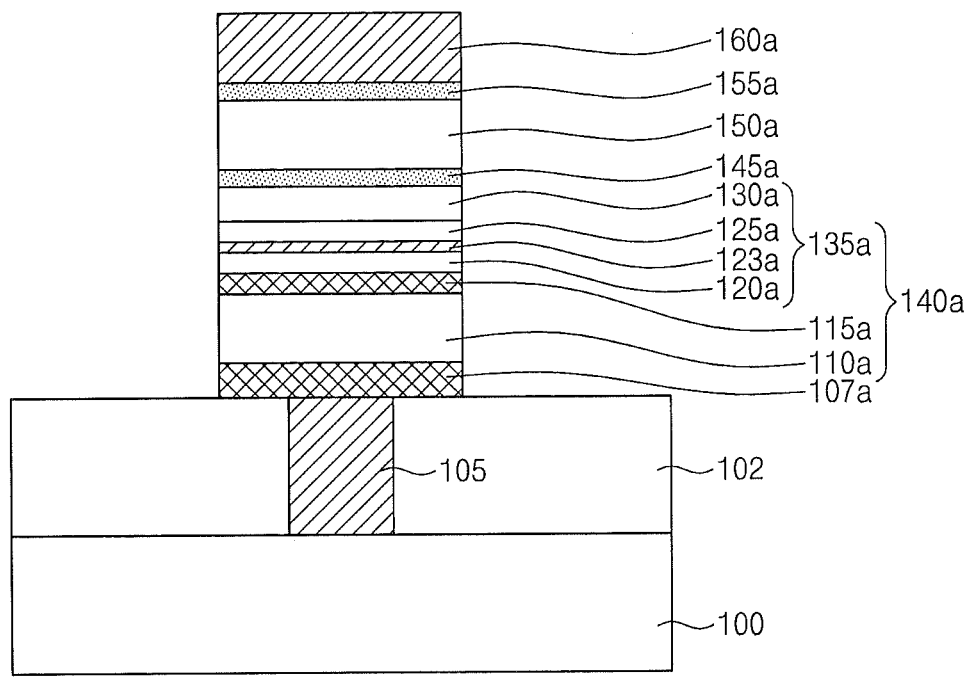
Figure 8:
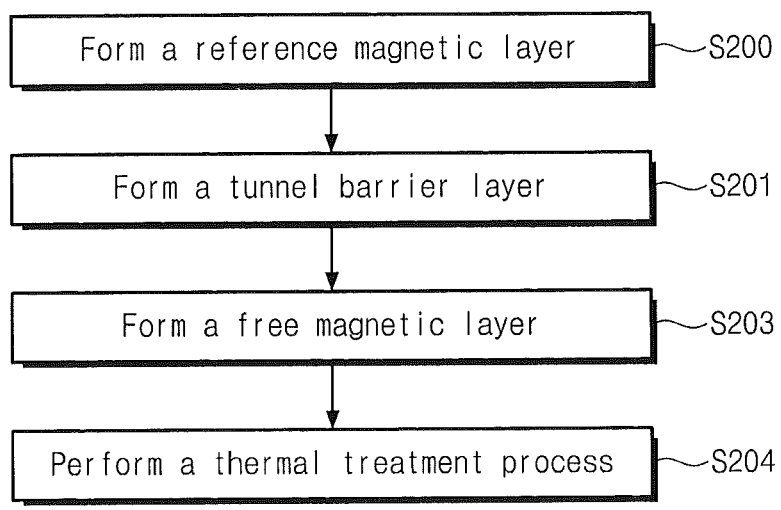
FIG. 8 is a flowchart illustrating operations of manufacturing a magnetic memory device according to some embodiments of inventive concepts.

FIGS. 6 and 7 are cross-sectional views illustrating operations of manufacturing a magnetic memory device according to some embodiments of inventive concepts. FIG. 8 is a flowchart illustrating operations of manufacturing a magnetic memory device according to some embodiments of inventive concepts.

Referring to FIGS. 6 and 8, a lower interlayer insulating layer 102 may be formed on a substrate 100. A lower contact plug 105 may be formed to penetrate the lower interlayer insulating layer 102.

A seed layer 107 may be deposited on the lower interlayer insulating layer 102. The seed layer 107 may be deposited using a physical vapor deposition (PVD) process, a chemical vapor deposition (CVD) process, and/or an atomic layer deposition (ALD) process. In some embodiments, the seed layer 107 may be deposited using a sputtering process (which is a type of PVD process).

A reference magnetic layer 140 may be formed on the seed layer 107 (S200). The reference magnetic layer 140 may include a first pinned layer 110, an exchange coupling layer 115, and a second pinned layer 135. In more detail, the first pinned layer 110 may be deposited on the seed layer 107. The first pinned layer 110 may be formed using the seed layer 107 as a seed. In some embodiments, the first pinned layer 110 may have the same crystal structure as the seed layer 107. For example, the seed layer 107 may be formed of ruthenium (Ru) having a hexagonal close packed (HCP) crystal structure, and the first pinned layer 110 may be formed of a cobalt-platinum (CoPt) alloy having the HCP crystal structure or a [Co/Pt]nL1$_1$ superlattice (where "n" is a natural number). The first pinned layer 110 may be deposited using a PVD process, a CVD process, and/or an ALD process.

In some embodiments, the first pinned layer 110 may be deposited using a sputtering process. If the first pinned layer 110 is formed of a CoPt alloy, the first pinned layer 110 may be formed using a sputtering process with argon (Ar) gas. In this case, the first pinned layer 110 may be formed of a CoPt alloy doped with boron to reduce saturation magnetization of the first pinned layer 110. Alternatively, if the first pinned layer 110 is formed of a [Co/Pt]nL1$_1$ superlattice, the first pinned layer 110 may be deposited using a sputtering process with an inert gas (e.g., krypton gas) having greater mass than the argon gas to improve perpendicular magnetic anisotropy of the [Co/Pt]nL1$_1$ superlattice.

The exchange coupling layer 115 may be deposited on the first pinned layer 110. In some embodiments, the exchange coupling layer 115 may be formed using the first pinned layer 110 as a seed. For example, the exchange coupling layer 115 may be formed of ruthenium having the HCP crystal structure. The exchange coupling layer 115 may be deposited using a PVD process, a CVD process, and/or an ALD process. In some embodiments, the exchange coupling layer 115 may be deposited using a sputtering process.

The second pinned layer 135 may be formed on the exchange coupling layer 115. The second pinned layer 135 may include an exchange-coupling enhancement magnetic layer 120, a non-magnetic layer 123, an intermediate magnetic layer 125, and a polarization enhancement magnetic layer 130. In more detail, the exchange-coupling enhancement magnetic layer 120 may be deposited on the exchange coupling layer 115. In some embodiments, the exchange-coupling enhancement magnetic layer 120 may have the same crystal structure as the exchange coupling layer 115. Thus, the exchange-coupling enhancement magnetic layer 120 may be formed using the exchange coupling layer 115 as a seed. For example, the exchange-coupling enhancement magnetic layer 120 may be formed of cobalt having the HCP crystal structure. The exchange-coupling enhancement magnetic layer 120 may be deposited using a PVD process, a CVD process, and/or an ALD process. In some embodiments, the exchange-coupling enhancement magnetic layer 120 may be deposited using a sputtering process.

The non-magnetic layer 123 may be deposited on the exchange-coupling enhancement magnetic layer 120. The non-magnetic layer 123 may have a crystal structure different from that of the exchange-coupling enhancement magnetic layer 120. For example, the non-magnetic layer 123 may have a body-centered cubic (BCC) crystal structure. For example, the non-magnetic layer 123 may be formed of tungsten. The non-magnetic layer 123 may be deposited using a PVD process, a CVD process, and/or an ALD process. In some embodiments, the non-magnetic layer 123 may be deposited using a sputtering process.

The intermediate magnetic layer 125 may be deposited on the non-magnetic layer 123. The intermediate magnetic layer 125 may be formed of a different magnetic material from the exchange-coupling enhancement magnetic layer 120. In some embodiments, the intermediate magnetic layer 125 may be formed of iron (Fe). In this case, the intermediate magnetic layer 125 may be deposited using the non-magnetic layer 123 as a seed and/or to provide nucleation sites. Thus, the intermediate magnetic layer 125 may have the same crystal structure as the non-magnetic layer 123. For example, the intermediate magnetic layer 125 may have the BCC crystal structure. In other embodiments, the intermediate magnetic layer 125 may be formed of iron doped with boron, i.e., iron-born (FeB). In this case, the deposited intermediate magnetic layer 125 may be in an amorphous state. The intermediate magnetic layer 125 may be deposited using a PVD process, a CVD process, and/or an ALD process. In some embodiments, the intermediate layer 125 may be deposited using a sputtering process.

The non-magnetic layer 123 and the intermediate magnetic layer 125 may be in contact with each other, thereby inducing interfacial perpendicular magnetic anisotropy at an interface between the non-magnetic layer 123 and the intermediate magnetic layer 125.

The polarization enhancement magnetic layer 130 may be deposited on the intermediate magnetic layer 125. The polarization enhancement magnetic layer 130 may include an element different from an element of the intermediate magnetic layer 125. For example, the polarization enhancement magnetic layer 130 may be formed of cobalt-iron-boron (CoFeB). The polarization enhancement magnetic layer 130 may be deposited using a PVD process, a CVD process, and/or an ALD process. In some embodiments, the polarization enhancement magnetic layer 130 may be deposited using a sputtering process. The deposited polarization enhancement magnetic layer 130 may be in an amorphous state. As a result, the reference magnetic layer 140 may be disposed on the seed layer 107.

A tunnel barrier layer 145 may be formed on the reference magnetic layer 140 (S201). In some embodiments, the tunnel barrier layer 145 may be formed using a sputtering with a tunnel barrier material as a target. The target may include the tunnel barrier material having controlled stoichiometry. Using the sputtering process with this target, an excellent/high-quality tunnel barrier layer 145 may be deposited on the reference magnetic layer 140. Thus, a heat-resistance characteristic of the tunnel barrier layer 145 may be improved. For example, the tunnel barrier layer 145 may be formed magnesium oxide (MgO) or aluminum oxide (AlO). In particular, the tunnel barrier layer 145 may be formed of magnesium oxide having a sodium chloride (NaCl) crystal structure.

A free magnetic layer 150 may be formed on the tunnel barrier layer 145 (S203). For example, the free magnetic layer 150 may be formed of cobalt-iron-boron (CoFeB). The free magnetic layer 150 may be deposited using a PVD process, a CVD process, and/or an ALD process. In some embodiments, the free magnetic layer 150 may be deposited using a sputtering process. The deposited free magnetic layer 150 may be in an amorphous state.

A thermal treatment process may be performed after the formation of the free magnetic layer 105 (S204). The polarization enhancement magnetic layer 130 and the free magnetic layer 150 may be crystallized by the thermal treatment process. Thus, a relatively high tunneling magnetoresistance ratio may be obtained. The thermal treatment process may be performed at a high temperature of about 400° C. or more to provide a sufficiently high magnetoresistance ratio. For example, the process temperature of the thermal treatment process may be in a range of about 400° C. to about 600° C. For example, the process temperature of the thermal treatment process may be in a range of about 400° C. to about 450° C. The crystallized polarization enhancement magnetic layer 130 may have the same crystal structure as the intermediate magnetic layer 125 and the non-magnetic layer 123. The crystallized free magnetic layer 150 may have the same crystal structure as the crystallized polarization enhancement magnetic layer 130. The free magnetic layer 150 may be crystallized using the tunnel barrier layer 145 as a seed during the thermal treatment process. In some embodiments, the tunnel barrier layer 145 may have the NaCl crystal structure, and the free magnetic layer 150 may have the BCC crystal structure.

If the deposited intermediate magnetic layer 125 is formed of an amorphous iron-boron (FeB), the amorphous iron-boron (FeB) may be crystallized during the thermal treatment process. At this time, boron included in the iron-boron (FeB) may improve a crystallizing speed of the iron-boron (FeB). Some of the boron atoms in the amorphous iron-boron (FeB) may diffuse/escape out of the intermediate magnetic layer 125 during the thermal treatment process. Thus, a boron concentration of the crystallized iron-boron (FeB) may be less than that of the deposited amorphous iron-boron (FeB).

In other embodiments, portions of the deposited polarization enhancement magnetic layer 130 and the deposited free magnetic layer 150 may be in a crystalline state, and the magnetic layers 130 and 150 may be substantially and/or entirely crystallized by the thermal treatment process.

A capping oxide layer 155 and a capping electrode layer 160 may be sequentially formed on the free magnetic layer 150. In some embodiments, the thermal treatment process may be performed after forming the capping electrode layer 160. In other embodiments, the thermal treatment process may be performed after forming the free magnetic layer 150 and before the forming of the capping oxide layer 155. For example, the capping oxide layer 155 may be formed of at least one of a magnesium oxide layer, a tantalum oxide layer, and/or an aluminum oxide layer. For example, the capping electrode layer 160 may be formed of at least one of a tantalum layer, a ruthenium layer, a titanium layer, and/or a platinum layer.

Referring to FIG. 7, the capping electrode layer 160, the capping oxide layer 155, the free magnetic layer 150, the tunnel barrier layer 145, the reference magnetic layer 140, and the seed layer 107 may be successively patterned to form a seed pattern 107a, a reference magnetic pattern 140a, a tunnel barrier pattern 145a, a free magnetic pattern 150a, a capping oxide pattern 155a, and a capping electrode 160a that are sequentially stacked.

The reference magnetic pattern 140a may include a first pinned pattern 110a, an exchange coupling pattern 115a, and a second pinned pattern 135a that are sequentially stacked on the seed pattern 107a. The second pinned pattern 135a may include an exchange-coupling enhancement magnetic pattern 120a, a non-magnetic pattern 123a, an intermediate magnetic pattern 125a and a polarization enhancement magnetic pattern 130a that are sequentially stacked on the exchange coupling pattern 115a.

Next, the upper interlayer insulating layer 165, the upper contact plug 167 and the interconnection 170, which are illustrated in FIG. 1, may be sequentially formed to provide the magnetic memory device of FIG. 1.

According to the aforementioned method of manufacturing the magnetic memory device, the second pinned layer 135 includes the non-magnetic layer 123 and the intermediate magnetic layer 125 that induce the interfacial perpendicular magnetic anisotropy. Thus, even though the thermal treatment process is performed at the high temperature, deterioration of the perpendicular magnetic anisotropy of the second pinned layer 135 may be reduced or minimized.

Additionally, the non-magnetic layer 123 may act as the seed of the intermediate magnetic layer 125 and the polarization enhancement magnetic layer 130. Thus, it is possible to easily form the intermediate magnetic layer 125 and the polarization enhancement magnetic layer 130 that have a crystal structure different from that of the exchange-coupling enhancement magnetic layer 120.

Next, modified examples of the manufacturing method described above will be described. Hereinafter, differences between the aforementioned embodiment and the modified examples will be mainly described in order to reduce redundancy of explanation.

Figure 9:
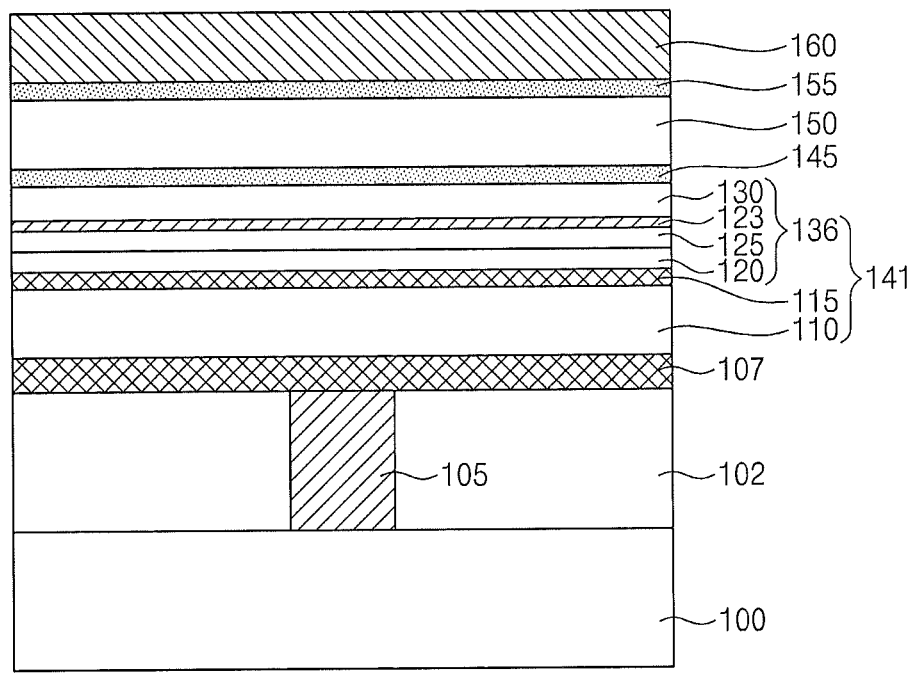
FIG. 9 is a cross-sectional view illustrating a modified example of operations of manufacturing a magnetic memory device according to some embodiments of inventive concepts.

FIG. 9 is a cross-sectional view illustrating a modified example of operations of manufacturing a magnetic memory device according to some embodiments of inventive concepts.

Referring to FIG. 9, in the present modified example, the intermediate magnetic layer 125 may be formed directly on the exchange-coupling enhancement magnetic layer 120, and the non-magnetic layer 123 may be formed directly on the intermediate magnetic layer 125. Thereafter, the polarization enhancement magnetic layer 130 may be formed on the non-magnetic layer 123. Thus, a second pinned layer 136 of a reference magnetic layer 141 may include the exchange-coupling enhancement magnetic layer 120, the intermediate magnetic layer 125, the non-magnetic layer 123 and the polarization enhancement magnetic layer 130 that are sequentially stacked on the exchange coupling layer 115. Other operations of the present modified example may be the same as corresponding operations described with reference to FIGS. 6, 7, and 8. Thus, the magnetic memory device of FIG. 2 may be provided.

In the present modified example, if the intermediate magnetic layer 125 may be formed of the amorphous iron-boron (FeB), the amorphous iron-boron may be crystallized using the non-magnetic layer 123 contacting a top surface of the intermediate magnetic layer 125 as a seed during the thermal treatment process.

Figure 10:
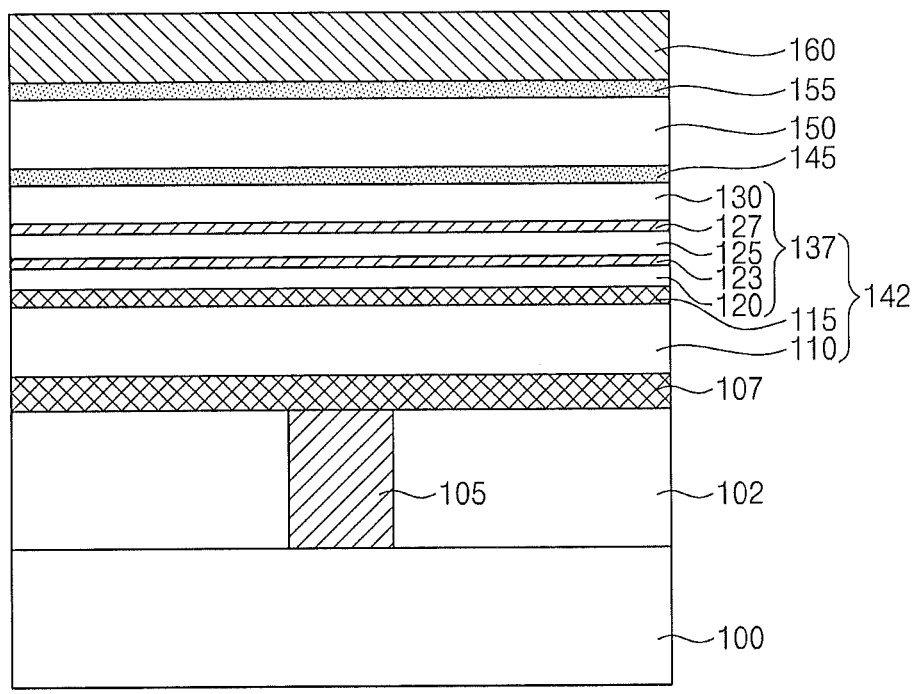
FIG. 10 is a cross-sectional view illustrating another modified example of operations of manufacturing a magnetic memory device according to some embodiments of inventive concepts.

FIG. 10 is a cross-sectional view illustrating another modified example of operations of manufacturing a magnetic memory device according to some embodiments of inventive concepts.

Referring to FIG. 10, a second pinned layer 137 of a reference magnetic layer 142 according to the present modified example may further include a second non-magnetic layer 127 formed between the intermediate magnetic layer 125 and the polarization enhancement magnetic layer 130. In other words, the second pinned layer 137 may include the exchange-coupling enhancement magnetic layer 120, the non-magnetic layer 123, the intermediate magnetic layer 125, the second non-magnetic layer 127 and the polarization enhancement magnetic layer 130 that are sequentially stacked on the exchange coupling layer 115. The second non-magnetic layer 127 may be formed of the same material as the non-magnetic layer 123. Additionally, the second non-magnetic layer 127 may be formed using the same method as used to form the non-magnetic layer 123. Other operations of the present modified example may be the same as corresponding operations described with reference to FIGS. 6, 7, and 8. Thus, the magnetic memory device of FIG. 3 may be provided.

Figure 11:
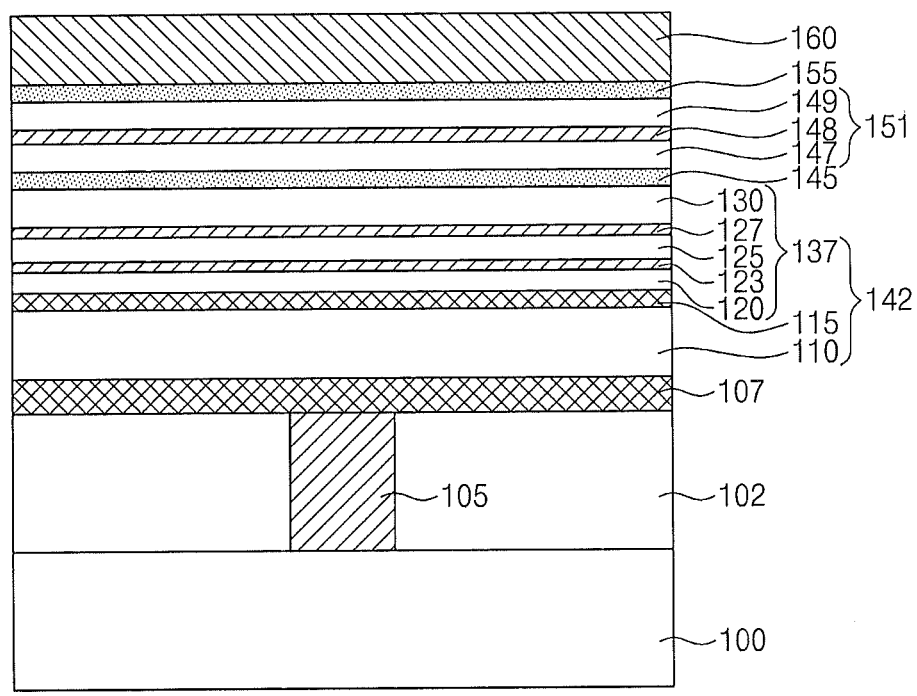
FIG. 11 is a cross-sectional view illustrating still another modified example of operations of manufacturing a magnetic memory device according to some embodiments of inventive concepts.

FIG. 11 is a cross-sectional view illustrating still another modified example of a method of manufacturing a magnetic memory device according to some embodiments of inventive concepts.

Referring to FIG. 11, a free magnetic layer 151 according to the present modified example may include a first free magnetic layer 147, an insertion layer 148, and a second free magnetic layer 149 that are sequentially stacked on the tunnel barrier layer 145. Each of the first and second free magnetic layers 147 and 149 may be formed of the same material as the free magnetic layer 150 described with reference to FIG. 6. Each of the first and second free magnetic layers 147 and 149 may be formed using a PVD process, a CVD process, and/or an ALD process. In some embodiments, each of the first and second free magnetic layers 147 and 149 may be formed using a sputtering process. The insertion layer 148 may be formed of a conductive material capable of inducing interfacial perpendicular magnetic anisotropy by contact with the first and second free magnetic layers 147 and 149. Additionally, the insertion layer 148 may be formed of a conductive material having a melting point higher than that of tantalum. For example, the insertion layer 148 may be formed of tungsten (W) or rhenium (Re). If the insertion layer 148 is formed of tungsten (W), the insertion layer 148 may have the same crystal structure (e.g., the BCC crystal structure) as the first and second free magnetic layers 147 and 149. Other operations of the present modified example may be the same as corresponding operations described with reference to FIGS. 6, 7, and 8. Thus, the magnetic memory device of FIG. 4 may be provided.

Figure 12:
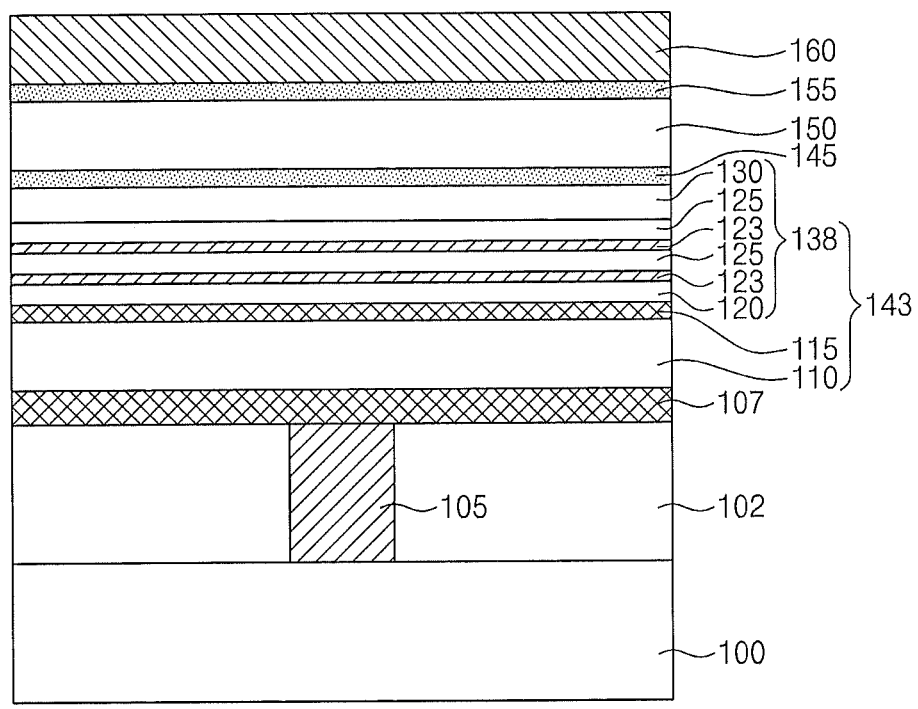
FIG. 12 is a cross-sectional view illustrating yet another modified example of operations of manufacturing a magnetic memory device according to some embodiments of inventive concepts.

FIG. 12 is a cross-sectional view illustrating yet another modified example of operations of manufacturing a magnetic memory device according to some embodiments of inventive concepts.

Referring to FIG. 12, a second pinned layer 138 of a reference magnetic layer 143 according to the present modified example may include non-magnetic layers 123 and intermediate magnetic layers 125 that are alternately stacked at least two times on the exchange-coupling enhancement magnetic layer 120. Other operations of the present modified example may be the same as corresponding operations described with reference to FIGS. 6, 7, and 8. Thus, the magnetic memory device of FIG. 5 may be provided.

In some embodiments, the second non-magnetic layer 127 may be formed between the uppermost one of the intermediate magnetic layers 125 and the polarization enhancement magnetic layer 130.

Next, a magnetic memory device according to other embodiments will be described. In the present embodiment, the same elements as described in the aforementioned embodiments will be indicated by the same reference numerals or the same reference designators. Descriptions of the same elements will be omitted or mentioned briefly for the purpose of ease and convenience in explanation. In other words, differences between the present embodiment and the aforementioned embodiment will be described hereinafter.

Figure 13:
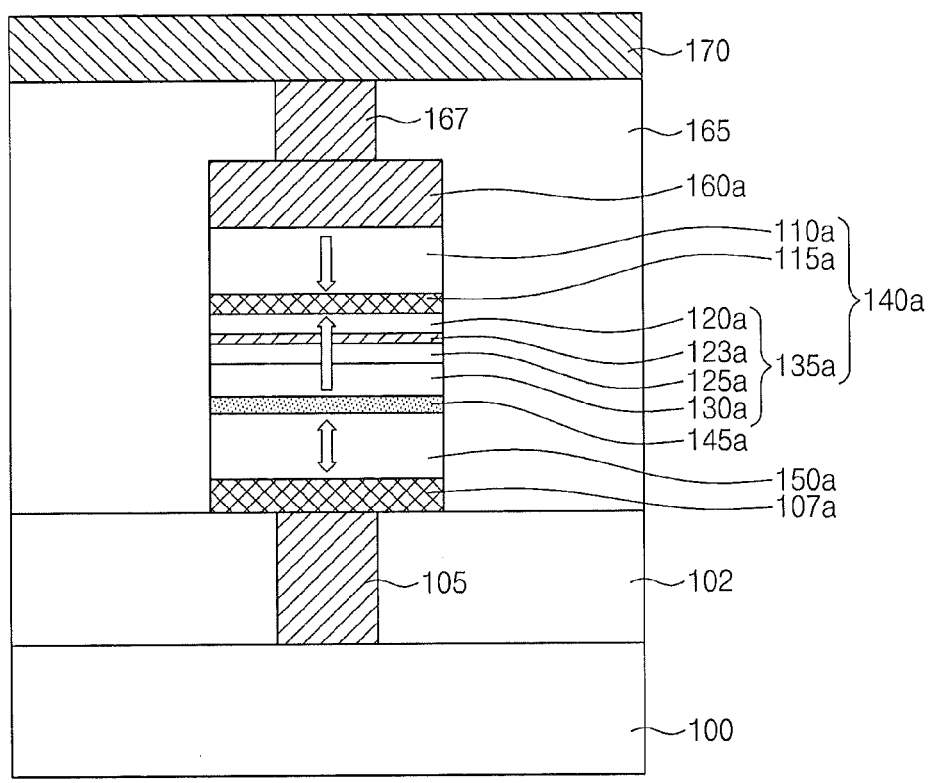
FIG. 13 is a cross-sectional view illustrating a magnetic memory device according to other embodiments of inventive concepts.

FIG. 13 is a cross-sectional view illustrating a magnetic memory device according to other embodiments of inventive concepts.

Referring to FIG. 13, according to the present embodiment, the free magnetic pattern 150a, the tunnel barrier pattern 145a, and the reference magnetic pattern 140a may be sequentially stacked on the seed pattern 107a. The reference magnetic pattern 140a may include a first pinned pattern 110a disposed on a top surface of the barrier tunnel pattern 145a, a second pinned pattern 135a disposed between the first pinned pattern 110a and the tunnel barrier pattern 145a, and the exchange coupling pattern 115a disposed between the first and second pinned patterns 110a and 135a.

The second pinned pattern 135a may include the polarization enhancement magnetic pattern 130a contacting the top surface of the tunnel barrier pattern 145a, the exchange-coupling enhancement magnetic pattern 120a contacting a bottom surface of the exchange coupling pattern 115a, and the non-magnetic pattern 123a and the intermediate magnetic pattern 125a disposed between the polarization enhancement magnetic pattern 130a and the exchange-coupling enhancement magnetic pattern 120a.

In some embodiments, the non-magnetic pattern 123a may be disposed between the intermediate magnetic pattern 125a and the exchange-coupling enhancement magnetic pattern 120a. A bottom surface and a top surface of the non-magnetic pattern 123a may be in contact with the intermediate magnetic pattern 125a and the exchange-coupling enhancement magnetic pattern 120a, respectively.

In the present embodiment, the free magnetic pattern 150a may be disposed directly on the seed pattern 107a. Thus, the seed pattern 107a may be formed of a conductive material capable of being used as a seed of the free magnetic pattern 150a. For example, if the free magnetic pattern 150a has the BCC crystal structure, the seed pattern 107a may include a conductive material having a NaCl crystal structure, e.g., titanium nitride and/or tantalum nitride.

In the present embodiment, the capping electrode 160a may be disposed directly on a top surface of the first pinned pattern 110a.

Next, modified examples of the magnetic memory device according to the present embodiment will be described. Hereinafter, differences between the embodiment of FIG. 13 and the modified examples will be described to reduce redundancy of explanation.

Figure 14:
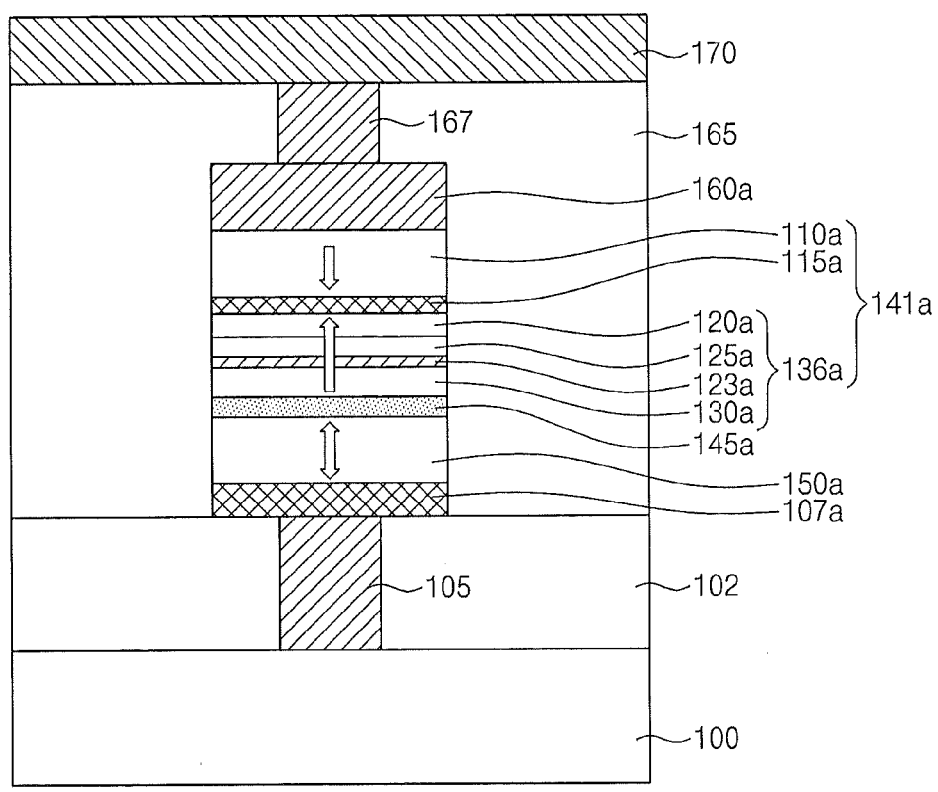
FIG. 14 is a cross-sectional view illustrating a modified example of a magnetic memory device according to other embodiments of inventive concepts.

FIG. 14 is a cross-sectional view illustrating a modified example of a magnetic memory device according to other embodiments of inventive concepts.

Referring to FIG. 14, a second pinned pattern 136a of a reference magnetic pattern 141a according to the present modified example may include the non-magnetic pattern 123a disposed between the polarization enhancement magnetic pattern 130a and the intermediate magnetic pattern 125a. The bottom surface and the top surface of the non-magnetic pattern 123a may be in contact with the polarization enhancement magnetic pattern 130a and the intermediate magnetic pattern 125a, respectively. In some embodiments, the top surface of the intermediate magnetic pattern 125a may be in contact with the exchange-coupling enhancement magnetic pattern 120a.

Figure 15:
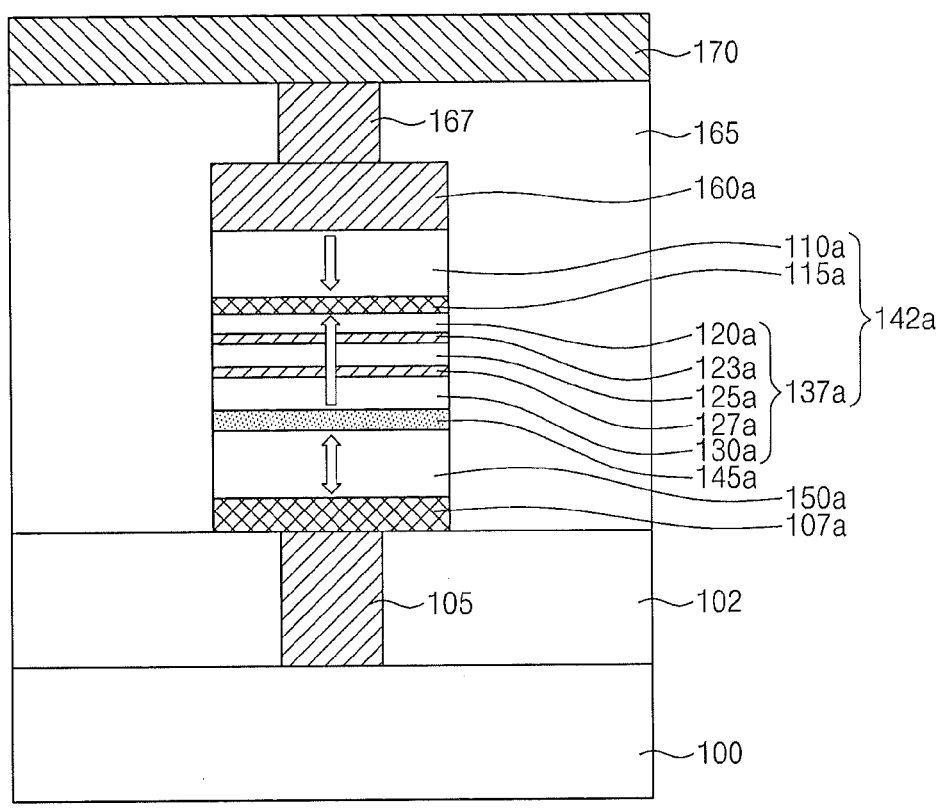
FIG. 15 is a cross-sectional view illustrating another modified example of a magnetic memory device according to other embodiments of inventive concepts.

FIG. 15 is a cross-sectional view illustrating another modified example of a magnetic memory device according to other embodiments of inventive concepts.

Referring to FIG. 15, a second pinned pattern 137a of a reference magnetic pattern 142a according to the present modified example may further include a second non-magnetic pattern 127a. The non-magnetic pattern 123a may be disposed between the intermediate magnetic pattern 125a and the exchange-coupling enhancement magnetic pattern 120a, and the second non-magnetic pattern 127a may be disposed between the intermediate magnetic pattern 125a and the polarization enhancement magnetic pattern 130a. The top surface and the bottom surface of the intermediate magnetic pattern 125a may be in contact with the non-magnetic pattern 123a and the second non-magnetic pattern 127a, respectively. The second non-magnetic pattern 127a may include the same material and the same crystal structure as the non-magnetic pattern 123a.

Figure 16:
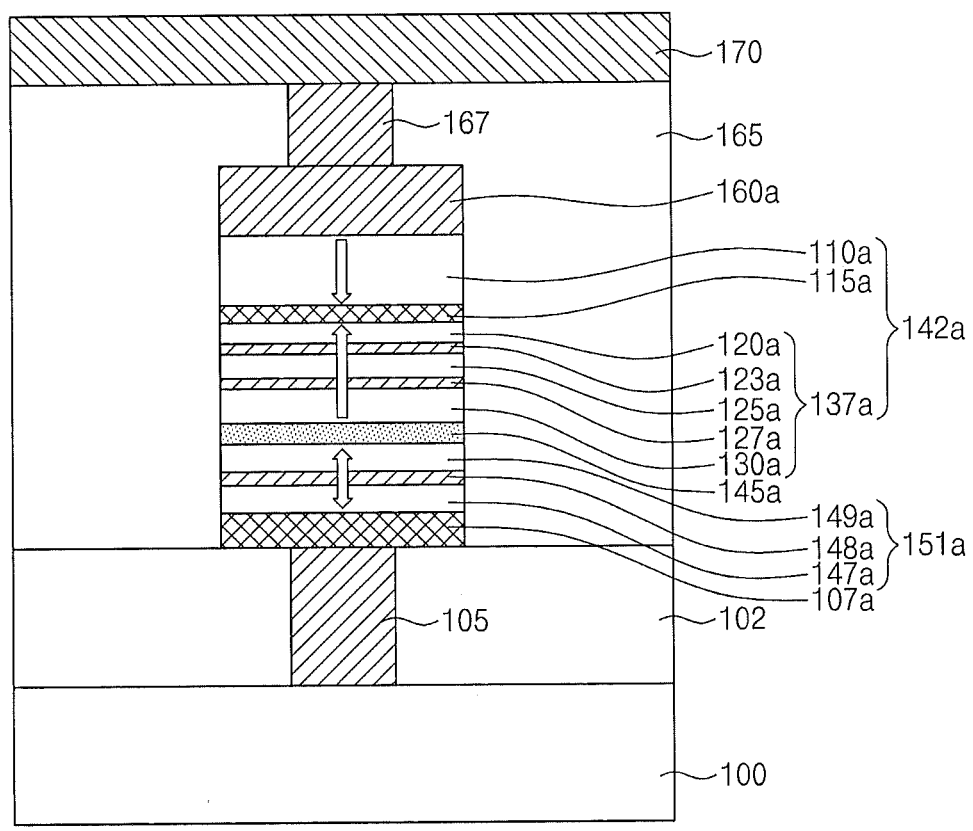
FIG. 16 is a cross-sectional view illustrating still another modified example of a magnetic memory device according to other embodiments of inventive concepts.

FIG. 16 is a cross-sectional view illustrating still another modified example of a magnetic memory device according to other embodiments of inventive concepts.

Referring to FIG. 16, a free magnetic pattern 151a according to the present modified example may include a first free magnetic pattern 147a, an insertion pattern 148a and a second free magnetic pattern 149a that are sequentially stacked on the seed pattern 107a. The first and second free magnetic patterns 147a and 149a and the insertion pattern 148a may have the same characteristics and features as described with reference to FIG. 4. The free magnetic pattern 151a may be applied to the magnetic memory devices illustrated in FIGS. 13 and 14.

Figure 17:
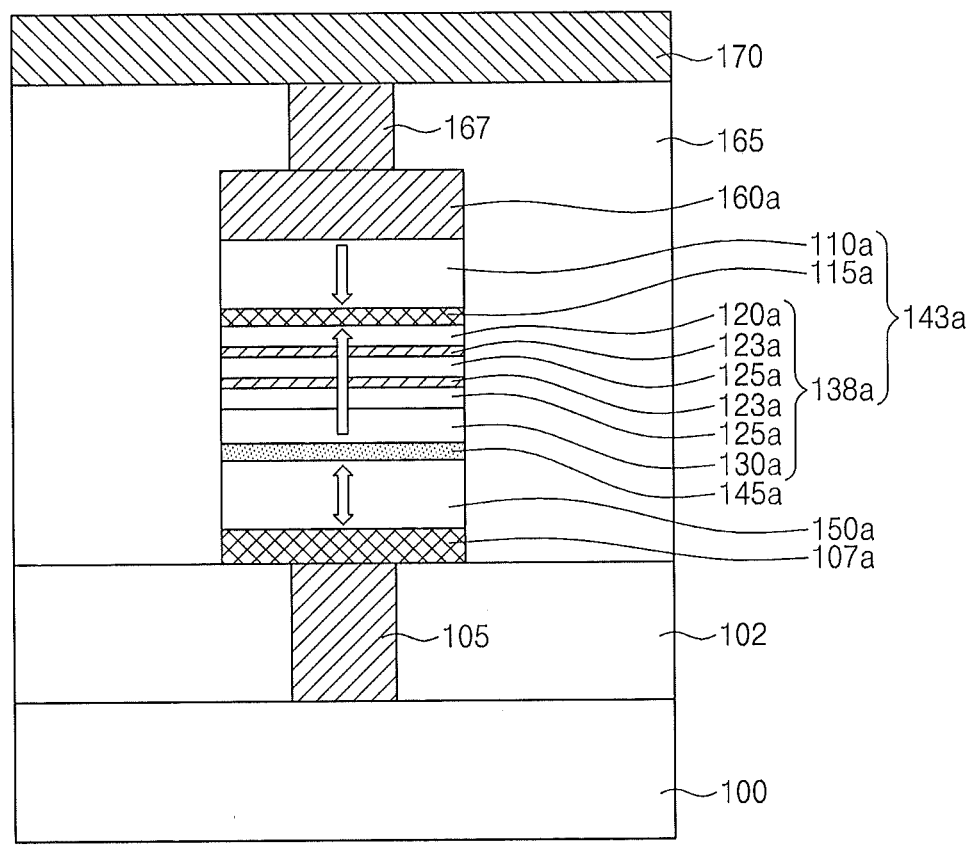
FIG. 17 is a cross-sectional view illustrating yet another modified example of a magnetic memory device according to other embodiments of inventive concepts.

FIG. 17 is a cross-sectional view illustrating yet another modified example of a magnetic memory device according to other embodiments of inventive concepts.

Referring to FIG. 17, a second pinned pattern 138a of a reference magnetic pattern 143a according to the present modified example may include intermediate magnetic patterns 125a and non-magnetic patterns 123a that are alternately stacked at least two times on the polarization enhancement magnetic pattern 130a.

In some embodiments, the second non-magnetic pattern 127a of FIG. 15 may be disposed between the lowermost one of the intermediate magnetic patterns 125a and the polarization enhancement magnetic pattern 130a.

A method of manufacturing the magnetic memory device according to the present embodiment will be described hereinafter.

Figure 18:
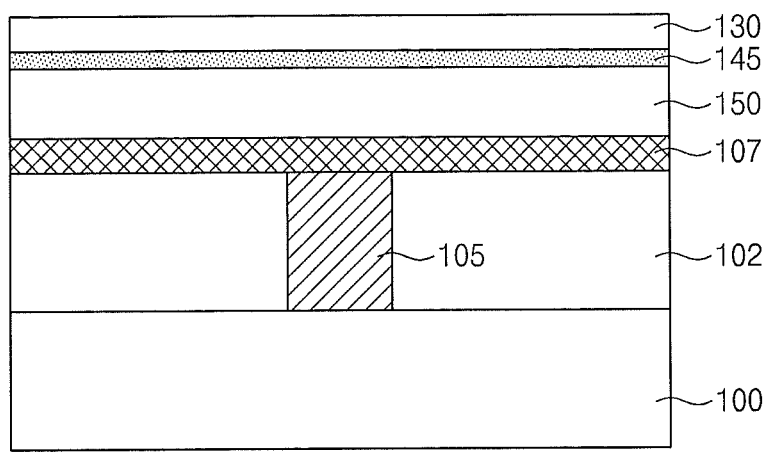
FIGS. 18 to 20 are cross-sectional views illustrating operations of manufacturing a magnetic memory device according to other embodiments of inventive concepts.
Figure 19:
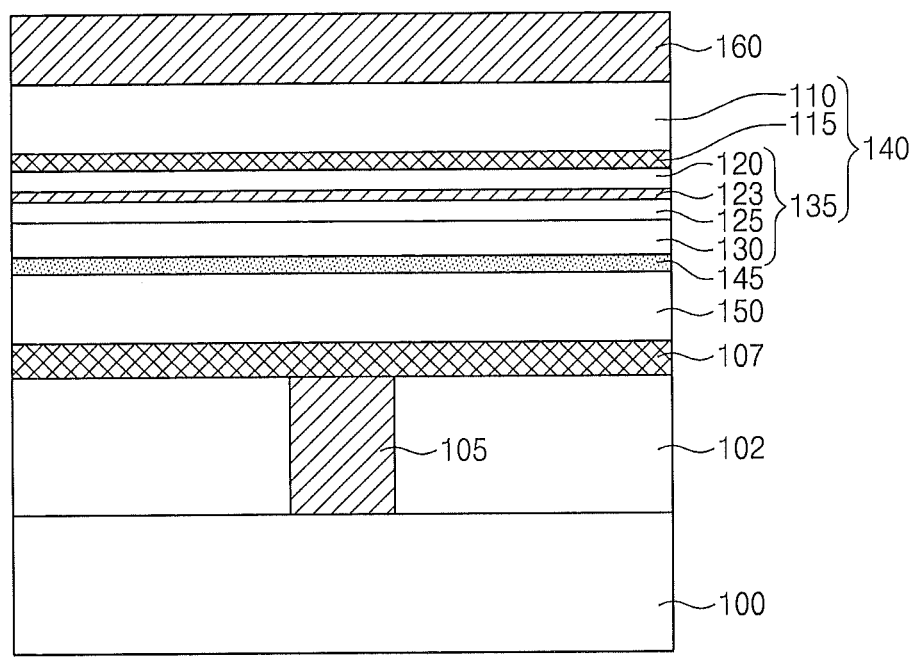
Figure 20:
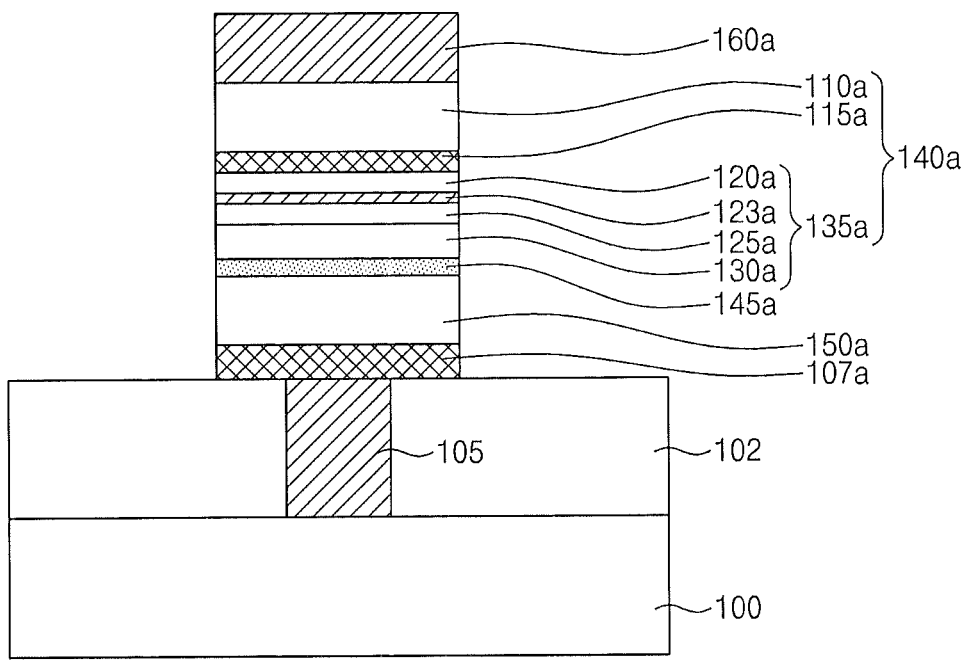
Figure 21:
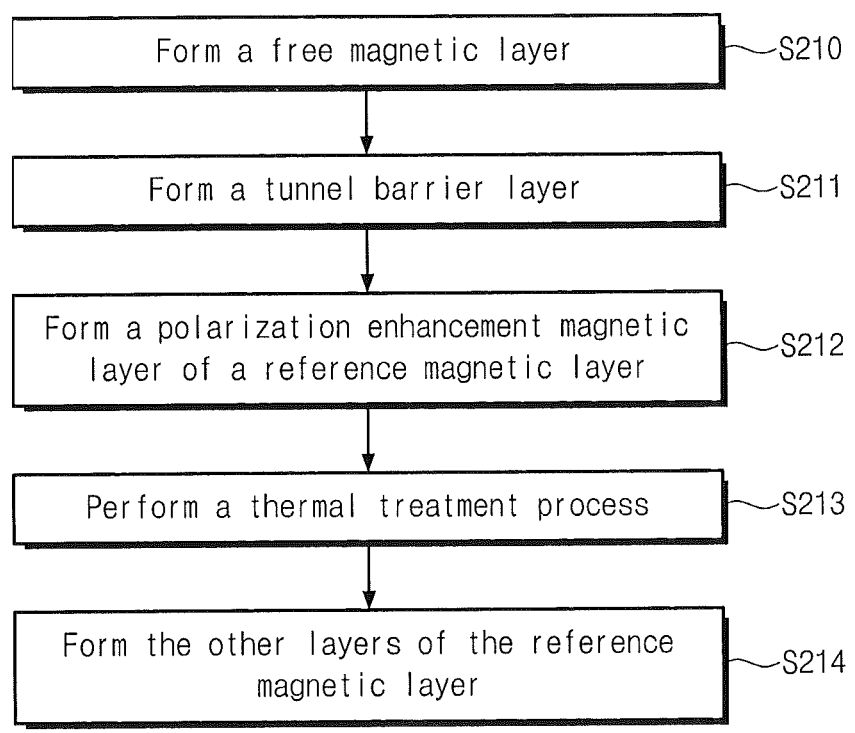
FIG. 21 is a flowchart illustrating operations of manufacturing a magnetic memory device according to other embodiments of inventive concepts.

FIGS. 18 to 20 are cross-sectional views illustrating operations of manufacturing a magnetic memory device according to other embodiments of inventive concepts. FIG. 21 is a flowchart illustrating operations of manufacturing a magnetic memory device according to other embodiments of inventive concepts.

Referring to FIGS. 18 and 21, a seed layer 107 may be formed on the lower interlayer insulating layer 102. A free magnetic layer 150 may be formed on the seed layer 107 (S210). The seed layer 107 may be formed of a conductive material capable of being used as a seed of the free magnetic layer 150. For example, the seed layer 107 may be formed of a conductive material having a NaCl crystal structure, e.g., titanium or tantalum. The free magnetic layer 150 may be deposited using a PVD process, a CVD process, and/or an ALD process. In some embodiments, the free magnetic layer 150 may be deposited using a sputtering process. A portion of the deposited free magnetic layer 150 may have a crystal structure or may be in an amorphous state.

A tunnel barrier layer 145 may be formed on the free magnetic layer 150 (S211). The tunnel barrier layer 145 may be formed by a sputtering using a target having controlled stoichiometry.

A polarization enhancement magnetic layer 130 of a reference magnetic layer may be formed on the tunnel barrier layer 145 (S212). The polarization enhancement magnetic layer 130 may be deposited using a PVD process, a CVD process, and/or an ALD process. In some embodiments, the polarization enhancement magnetic layer 130 may be deposited using a sputtering process. A portion of the deposited polarization enhancement magnetic layer 130 may have a crystal structure or may be in an amorphous state.

As illustrated in FIG. 21, a thermal treatment process may be performed (S213). The polarization enhancement magnetic layer 130 and the free magnetic layer 150 may be crystallized by the thermal treatment process. Thus, a tunneling magnetoresistance ratio of the polarization enhancement magnetic layer 130, the tunnel barrier layer 145, and the free magnetic layer 150 may be increased. The thermal treatment process may be performed at a high temperature of about 400° C. or more to increase the high magnetoresistance ratio. For example, the process temperature of the thermal treatment process may be in a range of about 400° C. to about 600° C. In particular, the process temperature of the thermal treatment process may be in a range of about 400° C. to about 450° C. In some embodiments, the thermal treatment process may be performed in-situ in a formation apparatus of the polarization enhancement magnetic layer 130. In other embodiments, the thermal treatment process may be performed in another apparatus after the formation of the polarization enhancement magnetic layer 130.

Referring to FIGS. 19 and 21, the other layers 125, 123, 120, 115 and 110 of the reference magnetic layer 140 may be formed (S214). The other layers 125, 123, 120, 115 and 110 may include a first pinned layer 110, an exchange coupling layer 115 and the other layers 125, 123 and 120 of a second pinned layer 135. In some embodiments, an intermediate magnetic layer 125, a non-magnetic layer 123, and an exchange-coupling enhancement magnetic layer 120 may be sequentially formed on the polarization enhancement magnetic layer 130. Thus, the second pinned layer 135 of the reference magnetic layer 140 may be formed. Next, the exchange coupling layer 115 and the first pinned layer 110 may be sequentially formed on the second pinned layer 135. A capping electrode layer 160 may be formed on the first pinned layer 110.

Referring to FIG. 20, the capping electrode layer 160, the reference magnetic layer 140, the tunnel barrier layer 145, the free magnetic layer 150, and the seed layer 107 may be successively patterned to form a seed pattern 107a, a free magnetic pattern 150a, a tunnel barrier pattern 145a, a reference magnetic pattern 140a, and a capping electrode 160a that are sequentially stacked on the lower interlayer insulating layer 102. The reference magnetic pattern 140a may include a first pinned pattern 110a, an exchange coupling pattern 115a, and a second pinned pattern 135a. The second pinned pattern 135a, the exchange coupling pattern 115a, and the first pinned pattern 110a may be sequentially stacked on the tunnel barrier pattern 145a.

The second pinned pattern 135a may include a polarization enhancement magnetic pattern 130a, an intermediate magnetic pattern 125a, a non-magnetic pattern 123a and an exchange-coupling enhancement magnetic pattern 120a that are sequentially stacked on a top surface of the tunnel barrier pattern 145a.

Subsequently, the upper interlayer insulating layer 165, the upper contact plug 167 and the interconnection 170 of FIG. 13 may be sequentially formed to manufacture the magnetic memory device of FIG. 13.

In the present embodiment, since the second pinned layer 135 includes the intermediate magnetic layer 125 and the non-magnetic layer 123 that induce the interfacial perpendicular magnetic anisotropy, it may be possible to improve process temperature margins of subsequent processes performed after the formation of the patterns 107a, 150a, 145a, 140a and 160a. For example, process temperatures of the subsequent processes may be high temperatures in a range of about 400° C. to about 600° C.

In the method described above, the thermal treatment process may be performed before the formation of the other layers 125, 123, 120, 115 and 110 of the reference magnetic layer 140. However, inventive concepts are not limited thereto. In other embodiments, the thermal treatment process may be performed after the formation of the reference magnetic layer 140. This will be described with reference to FIGS. 19 and 22.

Figure 22:
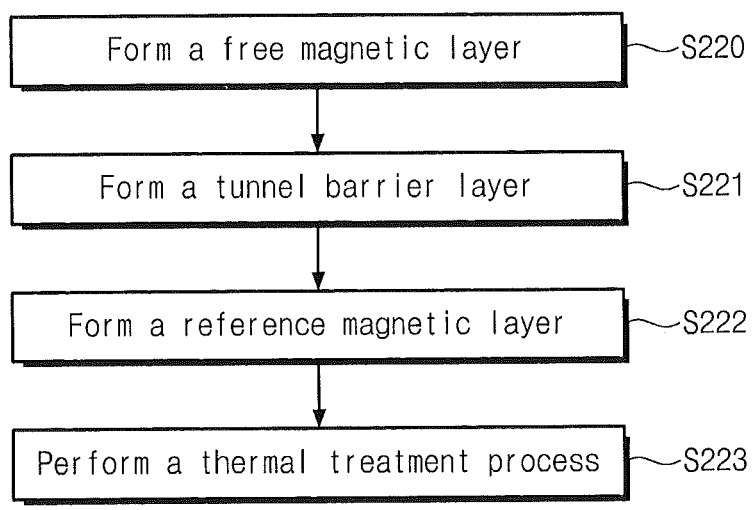
FIG. 22 is a flowchart illustrating another example of operations of manufacturing a magnetic memory device according to other embodiments of inventive concepts.

FIG. 22 is a flowchart illustrating another example of a method of manufacturing a magnetic memory device according to other embodiments of inventive concepts.

Referring to FIGS. 19 and 22, the free magnetic layer 150 may be formed on the seed layer 107 (S220). The tunnel barrier layer 145 may be formed on the free magnetic layer 150 (S221). The reference magnetic layer 140 may be formed on the tunnel barrier layer 145 (S222). At this time, an entire portion of the reference magnetic layer 140 may be formed on the tunnel barrier layer 145. Thereafter, the thermal treatment process may be performed (S223). The thermal treatment process may be performed after forming the reference magnetic layer 140 and before forming the capping electrode layer 160. Alternatively, the thermal treatment process may be performed after forming the capping electrode layer 160.

In the present example, since the second pinned layer 135 includes the non-magnetic layer 123 and the intermediate magnetic layer 125, the perpendicular magnetic anisotropy of the second pinned layer 135 may be enhanced in itself. Thus, even though the thermal treatment operation is performed after forming the reference magnetic layer 140, deterioration of the perpendicular magnetic anisotropy of the second pinned layer 135 may be reduced or minimized.

Next, modified examples of the manufacturing operations according to the present embodiment will be described. Hereinafter, differences between the aforementioned embodiment and the modified examples will be mainly described to reduce redundancy of explanation.

Figure 23:
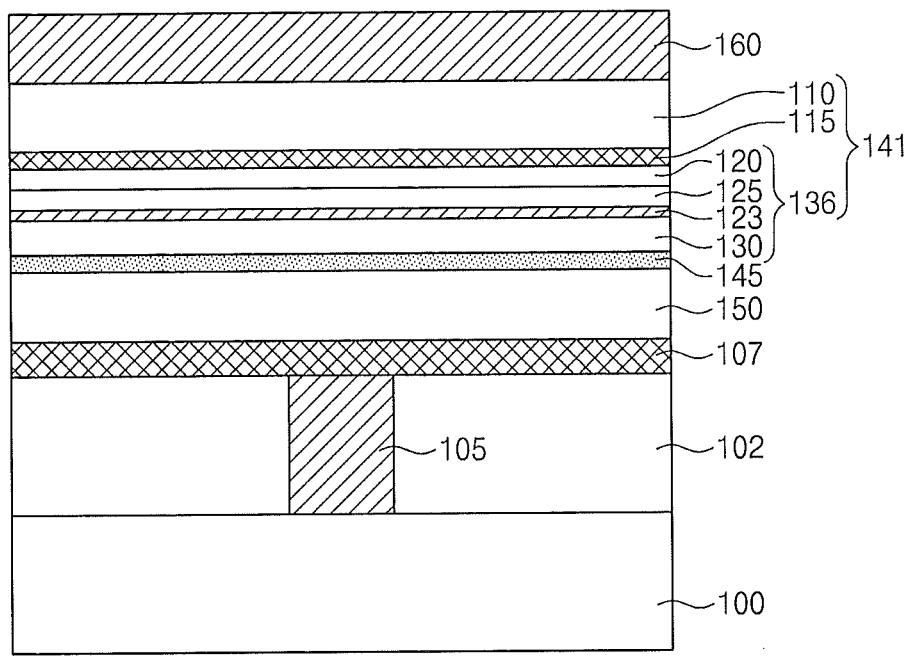
FIG. 23 is a cross-sectional view illustrating a modified example of operations of manufacturing a magnetic memory device according to other embodiments of inventive concepts.

FIG. 23 is a cross-sectional view illustrating a modified example of a method of manufacturing a magnetic memory device according to other embodiments of inventive concepts.

Referring to FIG. 23, in the present modified example, the non-magnetic layer 123 may be formed directly on the polarization enhancement magnetic layer 130, and the intermediate magnetic layer 125 may be formed directly on the non-magnetic layer 123. Thus, a second pinned layer 136 of a reference magnetic layer 141 according to the present modified example may include the polarization enhancement magnetic layer 130, the non-magnetic layer 123, the intermediate magnetic layer 125 and the exchange-coupling enhancement magnetic layer 120 that are sequentially stacked on the tunnel barrier layer 145. Other processes of the present modified example may be the same as corresponding processes described with reference to FIGS. 18, 19, 20, 21 and 22. Thus, the magnetic memory device of FIG. 14 may be provided.

Figure 24:
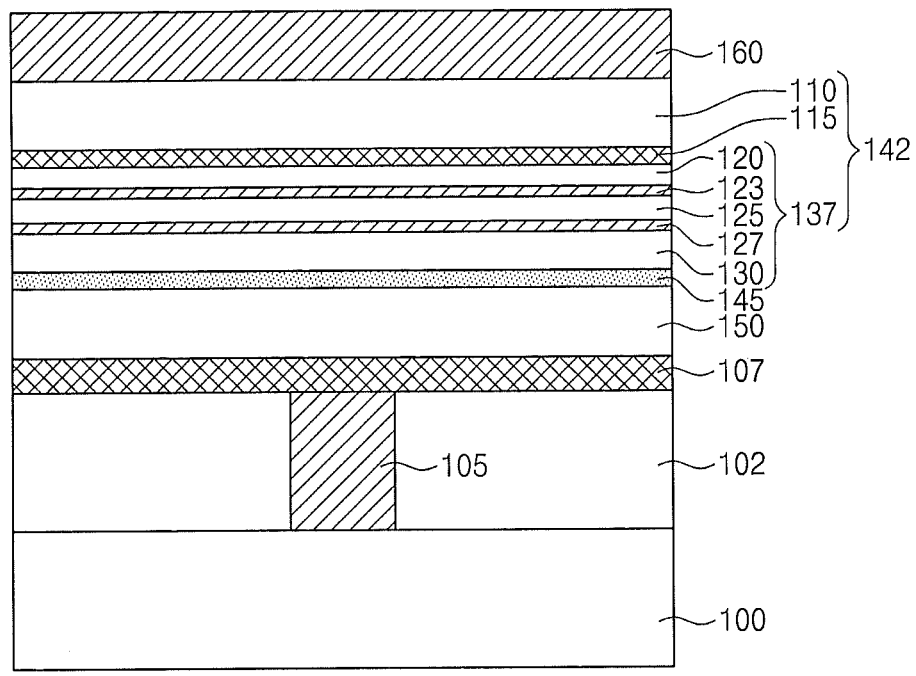
FIG. 24 is a cross-sectional view illustrating another modified example of operations of manufacturing a magnetic memory device according to other embodiments of inventive concepts.

FIG. 24 is a cross-sectional view illustrating another modified example of operations of manufacturing a magnetic memory device according to other embodiments of inventive concepts.

Referring to FIG. 24, a second pinned layer 137 of a reference magnetic layer 142 according to the present modified example may further include a second non-magnetic layer 127. In more detail, the non-magnetic layer 123 may be formed between the top surface of the intermediate magnetic layer 125 and the exchange-coupling enhancement magnetic layer 120, and the second non-magnetic layer 127 may be formed between the bottom surface of the intermediate magnetic layer 125 and the polarization enhancement magnetic layer 130. Other processes of the present modified example may be the same as corresponding processes described with reference to FIGS. 18, 19, 20, 21 and 22. Thus, the magnetic memory device of FIG. 15 may be provided.

Figure 25:
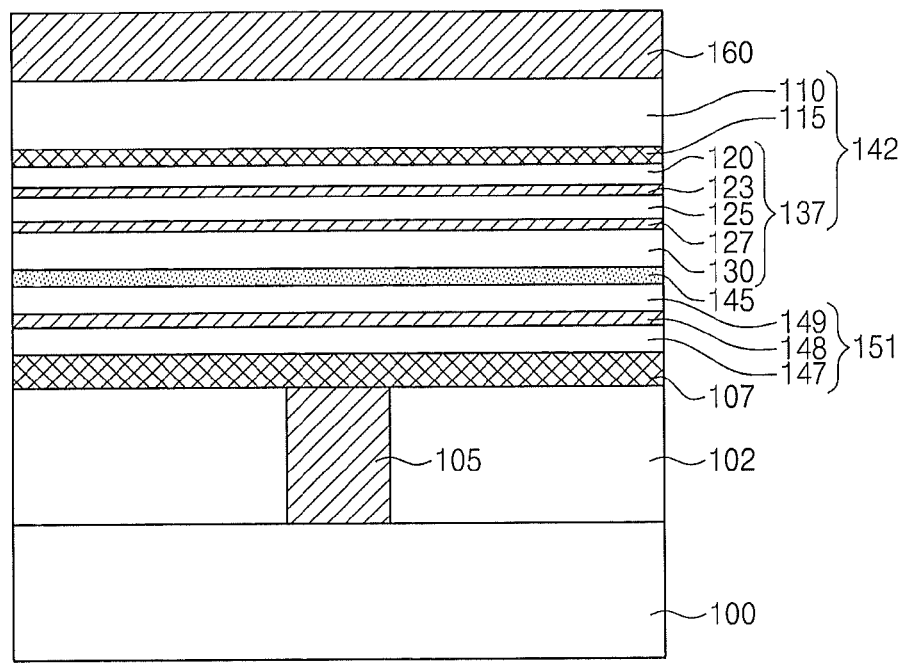
FIG. 25 is a cross-sectional view illustrating still another modified example of operations of manufacturing a magnetic memory device according to other embodiments of inventive concepts.

FIG. 25 is a cross-sectional view illustrating still another modified example of a method of manufacturing a magnetic memory device according to other embodiments of inventive concepts.

Referring to FIG. 25, a free magnetic layer 151 according to the present modified example may include a first free magnetic layer 147, an insertion layer 148, and a second free magnetic layer 149 that are sequentially formed on the seed layer 107. Other processes of the present modified example may be the same as corresponding processes described with reference to FIGS. 18, 19, 20, 21 and 22. Thus, the magnetic memory device of FIG. 16 may be provided.

Meanwhile, the intermediate magnetic layer 125 and the non-magnetic layer 123 may be alternately and repeatedly formed at least two times before the formation of the exchange-coupling enhancement magnetic layer 120 in the manufacturing method described with reference to FIG. 19. Thus, the magnetic memory device illustrated in FIG. 17 may be provided.

The magnetic memory devices described above may be encapsulated using various packaging techniques. For example, the magnetic memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and/or a wafer-level processed stack package (WSP) technique.

Figure 26:
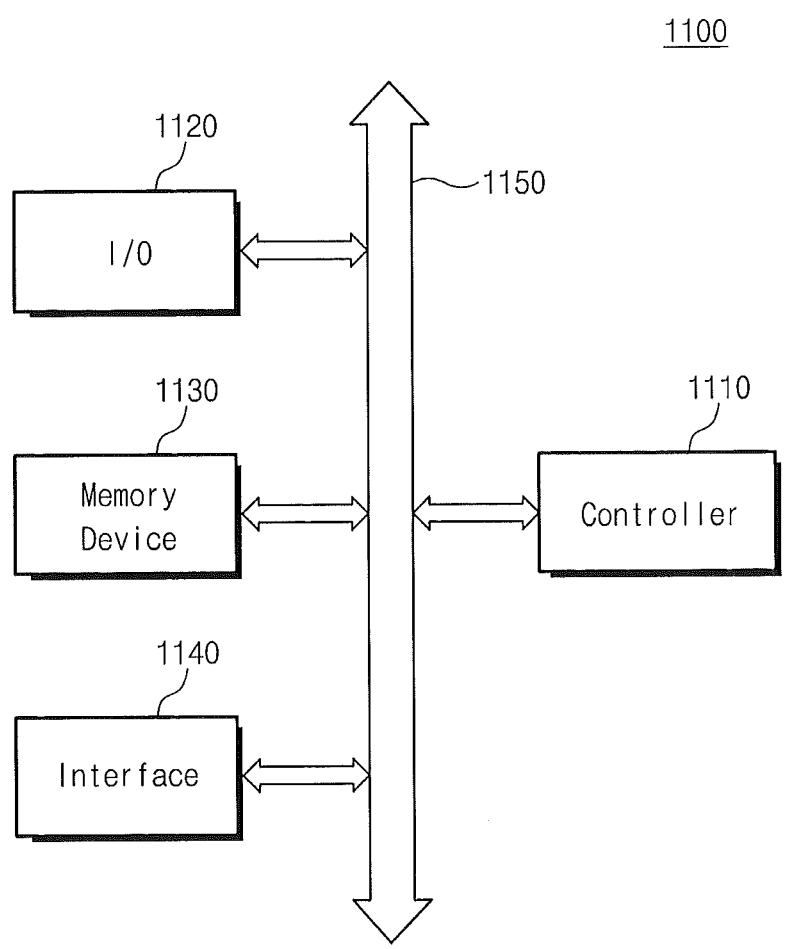
FIG. 26 is a schematic block diagram illustrating an example of electronic systems including magnetic memory devices according to embodiments of inventive concepts.

FIG. 26 is a schematic block diagram illustrating an example of electronic systems including magnetic memory devices according to embodiments of inventive concepts.

Referring to FIG. 26, an electronic system 1100 according to embodiments of inventive concepts may include a controller 1110, an input/output (I/O) unit 1120, a memory device 1130, an interface unit 1140 and a data bus 1150. At least two of the controller 1110, the I/O unit 1120, the memory device 1130, and/or the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and other logic devices having a similar function to any one thereof. The I/O unit 1120 may include at least one of a keypad, a keyboard, and a display unit. The memory device 1130 may store at least one of data and commands. The memory device 1130 may include at least one of the magnetic memory devices according to the embodiments described above. Additionally, the memory device 1130 may further include other types of semiconductor memory devices which are different from the magnetic memory devices described above. For example, the memory device 1130 may further include at least one of a flash memory device, a phase change memory device, a dynamic random access memory (DRAM) device, and a static random access memory (SRAM) device. The interface unit 1140 may transmit electrical data to a communication network and/or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory that may improve operation of the controller 1110.

The electronic system 1100 may be applied to a personal digital assistant (PDA), a portable computer, a web tablet, a wireless phone, a mobile phone, a digital music player, a memory card, or other electronic products. Other electronic products may receive and/or transmit information data wirelessly.

Figure 27:
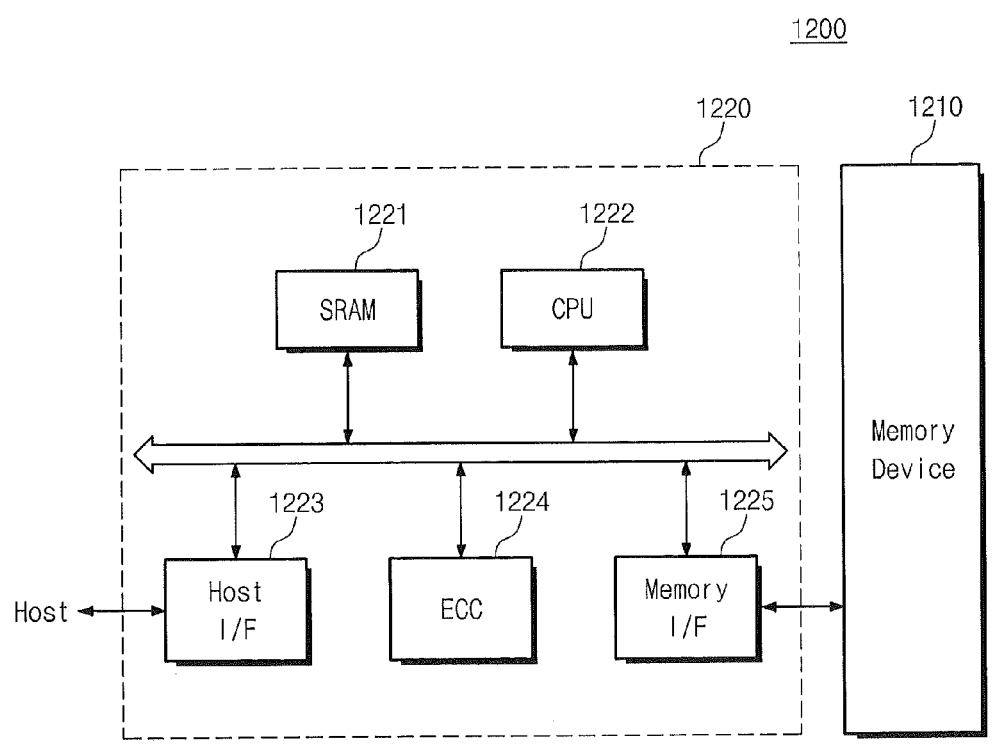
FIG. 27 is a schematic block diagram illustrating an example of memory cards including magnetic memory devices according to embodiments of inventive concepts.

FIG. 27 is a schematic block diagram illustrating an example of memory cards including magnetic memory devices according to embodiments of inventive concepts.

Referring to FIG. 27, a memory card 1200 according to an embodiment of inventive concepts may include a memory device 1210. The memory device 1210 may include at least one of the magnetic memory devices according to the embodiments mentioned above. Additionally, the memory device 1210 may further include other types of semiconductor memory devices which are different from the magnetic memory devices according to the embodiments described above. For example, the memory device 1210 may further include at least one of a phase change memory device, a flash memory device, a DRAM device, and/or a SRAM device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to provide a data communication protocol for communication between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be provided as a solid state disk (SSD) that is used as a hard disk of a computer system.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

According to embodiments of inventive concepts, the second pinned pattern between the exchange coupling pattern and the tunnel barrier pattern may include the non-magnetic pattern and the intermediate magnetic pattern as well as the polarization enhancement magnetic pattern. Here, the non-magnetic pattern may induce the interfacial perpendicular magnetic anisotropy at the interface between the intermediate magnetic pattern and the non-magnetic pattern. In other words, the perpendicular magnetic anisotropy of the second pinned pattern may be improved by the non-magnetic pattern and the intermediate magnetic pattern. Thus, the tunneling magnetoresistance ratio of the MTJ pattern may be improved, and it may be possible to reduce or minimize deterioration of characteristics of the MTJ pattern caused by high temperatures. As a result, magnetic memory devices having improved reliability may be provided.

Additionally, the non-magnetic pattern may function as the diffusion barrier against the atoms (e.g., platinum atoms) of the first pinned pattern, which are diffused toward the polarization enhancement magnetic pattern during the high temperature thermal treatment process. Thus, deterioration of reliability of the MTJ pattern may be reduced or minimized. Moreover, it may be possible to improve process temperature margins of the subsequent processes performed after forming the MTJ pattern.

Furthermore, the non-magnetic pattern may have the same crystal structure as the intermediate magnetic pattern. Thus, the non-magnetic pattern may act as a seed or nucleation layer to crystallize the intermediate magnetic pattern to the same crystal structure as the non-magnetic pattern. Thus, the second pinned pattern may be more easily formed.

While inventive concepts have been described with reference to example embodiments, it will be apparent to those skilled in the art that various changes and modifications may be made without departing from the spirits and scopes of inventive concepts disclosed herein. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

That which is claimed is:

1. A magnetic memory device comprising:
   a substrate; and
   a magnetic tunnel junction memory element on the substrate, wherein the magnetic tunnel junction memory element includes,
      a reference magnetic layer including a first pinned layer, an exchange coupling layer, and a second pinned layer wherein the exchange coupling layer is between the first and second pinned layers, and wherein the second pinned layer includes a first ferromagnetic layer, a first non-magnetic layer, a second ferromagnetic layer, and a third ferromagnetic layer sequentially stacked on the exchange coupling layer,
      a tunnel barrier layer wherein the second pinned layer is between the first pinned layer and the tunnel barrier layer, and
      a free magnetic layer wherein the tunnel barrier layer is between the reference magnetic layer and the free magnetic layer;

wherein the first non-magnetic layer induces interfacial perpendicular magnetic anisotropy at an interface of the first non-magnetic layer and the second ferromagnetic layer, wherein the first non-magnetic layer and the second ferromagnetic layer have a first crystal structure, wherein the exchange coupling layer and the first ferromagnetic layer have a second cryptal structure, and wherein the first and second crystal structures are different.

2. The magnetic memory device of claim 1 wherein each of the first, second, and third ferromagnetic layers comprises at least one of cobalt (Co), iron (Fe), iron-boron (FeB), and/or cobalt-iron-boron (CoFeB).

3. The magnetic memory device of claim 1 wherein the first non-magnetic layer comprises at least one of tungsten (W) and/or tantalum (Ta).

4. The magnetic memory device of claim 1 wherein the second ferromagnetic layer comprises cobalt (Co), and wherein the second ferromagnetic layer comprises at least one of iron (Fe) and/or iron-boron (FeB).

5. The magnetic memory device of claim 1 wherein the first ferromagnetic layer comprises at least one of iron (Fe) and/or iron-boron (FeB), and wherein the second ferromagnetic layer comprises cobalt-iron-boron (CoFeB).

6. The magnetic memory device of claim 1 wherein the first ferromagnetic layer comprises cobalt (Co), and wherein the second ferromagnetic layer comprises cobalt-iron-boron (CoFeB).

7. The magnetic memory device of claim 1 wherein the second pinned layer further includes a second non-magnetic layer, wherein the first ferromagnetic layer is between the first and second non-magnetic layers, and wherein the second non-magnetic layer is between the second and third ferromagnetic layers.

8. The magnetic memory device of claim 1 wherein the first non-magnetic layer comprises at least one of tungsten (W) and/or tantalum (Ta), and wherein the second ferromagnetic layer comprises iron and/or iron-boron.

9. The magnetic memory device of claim 1 wherein the second pinned layer further includes a second non-magnetic layer between the second and third ferromagnetic layers.

10. The magnetic memory device of claim 1 wherein the second crystal structure is a hexagonal close packed (HCP) crystal structure, and wherein the first crystal structure is a body-centered cubic (BCC) crystal structure.

11. The magnetic memory device of claim 10, wherein the second pinned layer further includes a second non-magnetic layer between the second and third ferromagnetic layers, and wherein the first and second non-magnetic layers have a body-centered cubic (BCC) crystal structure.

12. The magnetic memory device of claim 1 wherein magnetization directions of the reference and free magnetic layers are substantially perpendicular with respect to an interface between the free magnetic layer and the tunnel barrier layer.

13. The magnetic memory device of claim 1 wherein the first non-magnetic layer is between the second ferromagnetic layer and the first pinned layer, and wherein the first pinned layer and the second ferromagnetic layer have different crystal structures.

14. The magnetic memory device of claim 13 wherein the first pinned layer includes a cobalt-platinum (CoPt) alloy and/or a [Co/Pt]nL1$_1$ superlattice, where n is a natural number.

15. The magnetic memory device of claim 1 wherein the reference magnetic layer is between the tunnel barrier layer and the substrate, wherein the first pinned layer is between the exchange coupling layer and the substrate, and wherein the tunnel barrier layer is between the free magnetic layer and the substrate.

16. The magnetic memory device of claim 1 further comprising:
a capping oxide layer on the free magnetic layer wherein the magnetic tunnel junction memory element is between the capping oxide layer and the substrate.

17. The magnetic memory device of claim 16 wherein the capping oxide layer is configured to induce interfacial perpendicular magnetic anisotropy.

18. The magnetic memory device of claim 1 further comprising:
a seed layer between the substrate and the first pinned layer; and
a capping electrode on the free magnetic layer, wherein the magnetic tunnel junction memory element is between the seed layer and the capping electrode.

19. The magnetic memory device of claim 1 wherein the free magnetic layer is between the tunnel barrier layer and the substrate, wherein the tunnel barrier layer is between the second pinned layer and the substrate, wherein the second pinned layer is between the exchange coupling layer and the substrate, and wherein the exchange coupling layer is between the first pinned layer and the substrate.

20. A magnetic memory device comprising:
a substrate, and
a magnetic tunnel junction memory element on the substrate, wherein the magnetic tunnel junction memory element includes,
a reference magnetic layer including a first pinned layer, an exchange coupling layer, and a second pinned layer wherein the exchange coupling layer is between the first and second pinned layers, and wherein the second pinned layer includes a first ferromagnetic layer, a first non-magnetic layer, a second ferromagnetic layer, and a third ferromagnetic layer sequentially stacked on the exchange coupling layer,
a tunnel barrier layer wherein the second pinned layer is between the first pinned layer and the tunnel barrier layer, and
a free magnetic layer wherein the tunnel barrier layer is between the reference magnetic layer and the free magnetic layer;
wherein the first non-magnetic layer induces interfacial perpendicular magnetic anisotropy at an interface of the first non-magnetic layer and the second ferromagnetic layer,
wherein the second pinned layer further includes a second non-magnetic layer between the second and third ferromagnetic layers,
wherein the first ferromagnetic layer comprises cobalt (Co), wherein the first non-magnetic layer comprises at least one of tungsten (W) and/or tantalum (Ta), wherein the second ferromagnetic layer comprises at least one of iron (Fe) and/or iron-boron (FeB), wherein the second non-magnetic layer comprises at least one of tungsten (W) and/or tantalum (Ta), and wherein the third ferromagnetic layer comprises cobalt-iron-boron (CoFeB).

21. The magnetic memory device of claim 20 wherein the first non-magnetic layer and the second ferromagnetic layer have a first crystal structure, wherein the exchange coupling layer and the first ferromagnetic layer have a second crystal structure, and wherein the first and second crystal structures are different.

22. A magnetic memory device comprising:
   a substrate; and
   a magnetic tunnel junction memory element on the substrate, wherein the magnetic tunnel junction memory element includes,
      a reference magnetic layer including a first pinned layer, an exchange coupling layer, and a second pinned layer wherein the exchange coupling layer is between the first and second pinned layers, and wherein the second pinned layer includes a first ferromagnetic layer on the exchange coupling layer, a first non-magnetic layer, and a second ferromagnetic layer wherein the first non-magnetic layer is between the first and second ferromagnetic layers,
      a tunnel barrier layer wherein the second pinned layer is between the first pinned layer and the tunnel barrier layer, and
      a free magnetic layer wherein the tunnel barrier layer is between the reference magnetic layer and the free magnetic layer;
   wherein the first non-magnetic layer induces interfacial perpendicular magnetic anisotropy at an interface of the first non-magnetic layer and the second ferromagnetic layer,
   wherein the first non-magnetic layer and the second ferromagnetic layer have a first crystal structure, wherein the exchange coupling layer and the first ferromagnetic layer have a second crystal structure, and wherein the first and second crystal structures are different.

23. The magnetic memory device of claim 22 wherein the first non-magnetic layer comprises at least one of tungsten (W) and/or tantalum (Ta).

24. The magnetic memory device of claim 22 wherein the first ferromagnetic layer comprises cobalt (Co), and wherein the second ferromagnetic layer comprises at least one of iron (Fe) and/or iron-boron (FeB).

25. The magnetic memory device of claim 22 further comprising:
   a third ferromagnetic layer between the second ferromagnetic layer and the tunnel barrier layer, wherein the second ferromagnetic layer comprises at least one of iron (Fe) and/or iron-boron (FeB), and wherein the third ferromagnetic layer comprises cobalt-iron-boron (CoPeB).

26. The magnetic memory device of claim 22 wherein the first ferromagnetic layer comprises cobalt (Co), and wherein the second ferromagnetic layer comprises cobalt-iron-boron (CoFeB).

27. The magnetic memory device of claim 22 wherein the second pinned layer further includes a second non-magnetic layer on the second ferromagnetic layer and a third ferromagnetic layer on the second non-magnetic layer.

28. The magnetic memory device of claim 22 wherein the second crystal structure is a hexagonal close packed (HCP) crystal structure, and wherein the first crystal structure is a body-centered cubic (BCC) crystal structure.

29. The magnetic memory device of claim 28 wherein the first and second non-magnetic layers have a body-centered cubic (BCC) crystal structure.

30. The magnetic memory device of claim 22 wherein the reference magnetic layer is between the tunnel barrier layer and the substrate, wherein the first pinned layer is between the exchange coupling layer and the substrate, and wherein the tunnel barrier layer is between the free magnetic layer and the substrate.

31. The magnetic memory device of claim 22 wherein the free magnetic layer is between the tunnel barrier layer and the substrate, wherein the tunnel barrier layer is between the second pinned layer and the substrate, wherein the second pinned layer is between the exchange coupling layer and the substrate, and wherein the exchange coupling layer is between the first pinned layer and the substrate.

32. A magnetic memory device comprising:
   a substrate; and
   a magnetic tunnel junction memory element on the substrate, wherein the magnetic tunnel junction memory element includes,
      a reference magnetic layer including first pinned layer an exchange coupling layer, and a second pinned layer wherein the exchange coupling layer is between the first and second pinned layers, and wherein the second pinned layer includes a first ferromagnetic layer on the exchange coupling laver, a first non-magnetic layer, and a second ferromagnetic layer wherein the first non-magnetic layer is between the first and second ferromagnetic layers,
      a tunnel barrier layer wherein the second pinned layer is between the first pinned layer and the tunnel barrier layer, and
      a free magnetic layer wherein the tunnel barrier layer is between the reference magnetic layer and the free magnetic layer;
   wherein the first non-magnetic layer induces interfacial perpendicular magnetic anisotropy at an interface of the first non-magnetic layer and the second ferromagnetic layer,
   wherein the second pinned layer further includes a second non-magnetic layer on the second ferromagnetic layer and a third ferromagnetic layer on the second non-magnetic layer,
   wherein the first ferromagnetic layer comprises cobalt (Co), wherein the first non-magnetic layer comprises at least one of tungsten (W) and/or tantalum (Ta), wherein the second ferromagnetic layer comprises at least one of iron (Fe) and/or iron-boron (FeB), wherein the second non-magnetic layer comprises at least one of tungsten (W) and/or tantalum (Ta), and wherein the third ferromagnetic layer comprises cobalt-iron-boron (CoFeB).

33. The magnetic memory device of claim 32 wherein the first non-magnetic layer and the second ferromagnetic layer have a first crystal structure, wherein the exchange coupling layer and the first ferromagnetic layer have a second crystal structure, and wherein the first and second crystal structures are different.

* * * * *